United States Patent [19]
Kawamoto et al.

[11] Patent Number: 5,818,075
[45] Date of Patent: Oct. 6, 1998

[54] CHARGE TRANSFER DEVICE

[75] Inventors: Seiichi Kawamoto; Yasuhito Maki; Tadakuni Narabu; Masahide Hirama, all of Kanagawa, Japan

[73] Assignee: Sony Corporation, Tokyo, Japan

[21] Appl. No.: 697,178

[22] Filed: Aug. 20, 1996

Related U.S. Application Data

[60] Continuation of Ser. No. 476,029, Jun. 7, 1995, abandoned, which is a division of Ser. No. 263,451, Jun. 21, 1994, abandoned.

[30] Foreign Application Priority Data

Jun. 22, 1993 [JP] Japan .................................. 5-150316
Sep. 21, 1993 [JP] Japan .................................. 5-221066
Dec. 21, 1993 [JP] Japan .................................. 5-321730

[51] Int. Cl.$^6$ ...................... H01L 27/148; H01L 29/768
[52] U.S. Cl. .............................. 257/239; 377/59; 377/60; 377/62
[58] Field of Search ................................ 257/239; 377/59, 377/60, 61, 62, 63; 348/295, 303, 312, 322, 324

[56] References Cited

U.S. PATENT DOCUMENTS 4,939,560 7/1990 Narabu et al. ......................... 257/239
5,227,650 7/1993 Noguchi et al. ....................... 257/239

FOREIGN PATENT DOCUMENTS

A-0 192 142 8/1986 European Pat. Off. .
A-60 123 063 7/1985 Japan .

Primary Examiner—Ngân V. Ngâ
Attorney, Agent, or Firm—Hill, Steadman & Simpson

[57] ABSTRACT

A charge transfer device comprising charge transfer means for transferring charges, a floating diffusion layer for accumulating the charges transferred from said charge transfer means, a floating gate electrode formed on said floating diffusion layer via an insulating layer, charge detection means connected to the floating gate electrode for outputting a voltage corresponding to an amount of charges accumulated in the floating diffusion layer, first precharge means connected to the floating gate electrode, the first precharge means starting precharging of the floating gate electrode responsive to transition of a first pulse voltage from a first state to a second state, the first precharge means terminating precharging of the floating gate electrode responsive to transition of the first pulse voltage from the second state to the first state, second precharge means connected to the floating diffusion layer, the second precharge means starting precharging of the floating diffusion layer responsive to transition of a second pulse voltage from a third state to a fourth state, the second precharge means terminating precharging of the floating diffusion layer responsive to transition of the second pulse voltage from the fourth state to the third state, first pulse supply means for supplying the first pulse voltage to the first precharge means, and second pulse supply means for supplying the second pulse voltage to the second precharge means, transition of the second pulse voltage from the third state to the fourth state being produced following transition of the first pulse voltage from the first state to the second state. In a preferred embodiment, transition of the first pulse voltage from the second state to the first state is produced following transition of the second pulse voltage from the fourth state to the third state.

6 Claims, 17 Drawing Sheets

(PRIOR ART) Pg (PRIOR ART) Pr (PRIOR ART) S

OUTPUT VOLTAGE

FIG.12A P1
FIG.12B P2
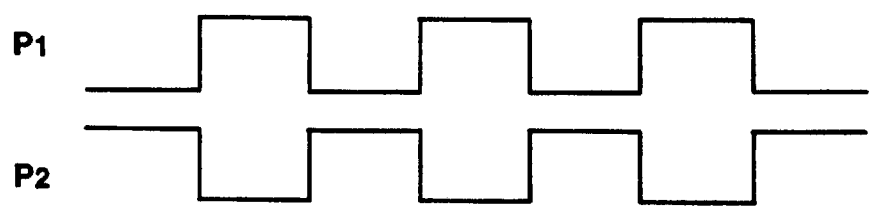
FIG.13A Pg
FIG.13B Pr
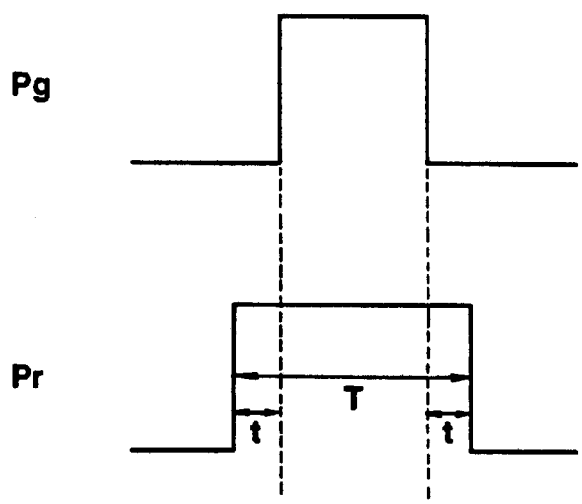

CHARGE TRANSFER DEVICE

This is a continuation of application Ser. No. 08/476.029, filed Jun. 7, 1995 now abandoned, which is a division of application Ser. No. 08/263.451 filed Jun. 21. 1994 now abandoned.

BACKGROUND OF THE INVENTION

This invention relates to a charge transfer device and, more particularly, to a charge transfer device which may be advantageously employed in a charge transfer stage inclusive of an output section of a CCD solid-state imaging device.

In general, a charge transfer device employed in a charge transfer stage including an output section of a CCD solid-state imaging device is made up of a charge transfer unit for sequentially transferring signal charges and a charge detection unit constituted by a floating diffusion amplifier or a floating gate amplifier.

Above all, the charge detection unit by the floating gate amplifier employs a floating gate for non-destructively detecting the size of a signal charge lump as an image charge. Besides, it can be easily increased in density, while it has a small parasitic capacity and high sensitivity and is susceptible to noise to a lesser extent.

Such conventional charge transfer device has a p-type silicon substrate, for example, not shown, on which are formed a charge transfer section 1 for sequentially transferring signal charges e and a charge detection section 2 for detecting signal charges e transferred on the charge transfer section 1, as shown in FIG. 1.

In FIG. 1, the signal transfer section 1 is of a two-phase drive transfer system in which the signal charges e are transferred using two-phase clock pulses $P_1$, $P_2$ oppositely phased relative to each other. A charge transfer channel, not shown, which is a transfer channel for the signal charges e, is formed on top of the surface of the above-mentioned p-type silicon substrate. On a region of the charge transfer channel, a large number of sets of transfer electrodes, each consisting of a transfer gate electrodes (TG electrodes) 3 and a storage gate electrode (SG electrode) 4, are arrayed for extending in pre-set directions.

The clock pulse $P_1$ is supplied to an odd group of the TG electrodes 3a and the SG electrodes 4a via an input terminal $\Phi_1$, while the other clock pulse $P_2$ is supplied to an even group of the TG electrodes 3b and the SG electrodes 4b via an input terminal $\Phi_2$, whereby the signal charges e are transferred by the two-phase driving system towards the charge detecting section 2.

The charge detecting section 2 is constituted by a floating gate amplifier for non-destructively detecting the signal charges e transferred from the charge transfer section 1. The floating gate amplifier is made up of a first output gate electrode (first OG electrode) 5, formed adjacent to the SG electrode 4b of the final stage of the charge transfer section 1, floating gate electrodes (FG electrodes) 6, pre-charge gate electrodes (PG electrodes) 7a, 7b, a second, output gate electrode (second OG electrode) 8 and a drain region 9. Similarly to the transfer electrode of the charge transfer section 1, the PG electrodes 7a, 7b are constituted by two electrodes, and are designed so that a potential barrier below the PG electrode 7a adjacent to the FG electrode 6 is higher than the potential barrier below the other PG electrode wall 7a.

In order for the level of the potential barrier below the PG electrode 7a adjacent to the FG electrode 6 to be lower than that of the potential barrier below the other PG electrode 7b, a channel region 12 below the PG electrode 7a adjacent to the FG electrode 6 is designed as an N-type impurity diffusion region of low impurity concentration, while the channel region 13 below the other PG electrode 7b is designed as an N-type impurity diffusion region of high impurity concentration. This enables the potential of the channel region 12 and the potential of the channel region 13 to be shallower and deeper in the state of thermal equilibrium. That is, a potential having a step-like descending shape is formed in the charge transfer direction.

Direct current voltages Vog1, Vog2 are supplied via input terminals $\pm_3$, $\pm_5$ to the first OG electrode 5 and the second OG electrode 8, respectively, whereby fixed potential barriers are formed below the first OG electrode 5 and the second OG electrode 8, respectively. A control pulse Pg is supplied via an input terminal $\Phi_4$ to each of the PG electrodes 7a and 7b so that the potential below the PG electrodes 7a, 7b becomes higher, while the potential barrier below the PG electrode 7a becomes lower than the potential well below the FG electrode 6. At this time, the electrical charge is transferred to below the other PG electrode 7b over the potential barrier below the PG electrode 6.

When the control pulse Pg ceases to be supplied to the PG electrodes 7a, 7b, the potential below the PG electrodes 7a, 7b is lowered and an initial state is again reached, that is, the potential barrier below the PG electrode 7b becomes higher than the potential barrier below the neighboring second OG electrode 8. At this time, the signal charge e accumulated below the PG electrode 7b is swept into a neighboring drain region 9 over the potential barrier below the second OG electrode 8, as shown.

A reset pulse Pr is supplied to the gate electrode of the FG electrode 6, the drain terminal of which is connected to the source of a switching transistor Tr, the drain terminal of which is fed with a power source voltage for resetting Vr. The potential below the FG electrode 6 is reset, that is fixed at a level corresponding to the source voltage Vr, by the aforementioned reset pulse Pr being fed to the gate electrode of the switching transistor Tr. An amplifier in, for example, a source follower configuration 10 is connected to the downstream side of the FG electrode 6. After the reset pulse Pr ceases to be supplied to the gate electrode of the switching transistor, voltage changes by the signal voltage e transferred to and accumulated below the FG electrode 6 are supplied to the amplifier 10 so as to be outputted as an output signal S at an output terminal $\Phi$out.

With the above-described charge transfer device, the signal charge e needs to be accumulated in a potential well below the FG electrode 6 and be swept into the drain region 9 via a region below the PG electrodes 7a, 7b and the second OG electrode after outputting of the output signal S. To this end, it becomes necessary for the potential barrier below the PG electrode 7a to be deeper than the potential well below the FG electrode 6.

However, since the source voltage for resetting Vr, supplied to the FG electrode 6, is of a larger magnitude, a still larger voltage is required in order to produce a potential deeper than the potential well below the PG electrode 6. On the other hand, with the conventional charge transfer device, a transfer channel 11 below the FG electrode 6 is an N-type impurity diffusion region of high impurity concentration, as indicated by N in FIG. 1, while a transfer channel 12 below the PG electrode 7a is an N-type impurity diffusion region of low impurity concentration, as indicated by N⁻ in FIG. 1, so that a potential deeper than the potential well below the FG electrode 6 cannot be produced unless a still larger voltage is applied to a region below the PG electrode 7a.

Consequently, should the voltage to be supplied to the PG electrode 7a and the resetting source voltage to be applied to the FG electrode 6 be obtained from the same power source, a booster circuit needs to be interposed for boosting the voltage supplied to the PG electrode 7a.

The booster circuit is usually constituted by a charging pump which is in need of a wide capacity and area. This reads to an increased area set aside for the charge transfer channel 1 and a peripheral circuit, thus increasing the number of transfer stages in the charge transfer channel 1 and making it difficult to form the peripheral circuit on one and the same chip.

On the other hand, with the above-described conventional charge transfer device, the control pulse Pg having a pulse width T is delayed by time t for generating the reset pulse Pr to be supplied to the gate electrode of the switching transistor Tr for resetting the voltage level of the FG electrode 6, as shown in FIG. 2. Thus the voltage level below the FG electrode 6 is reset after lapse of the delay time t as from the time the control pulse Pg reaches a high level.

Meanwhile, the potential barrier formed below the PG electrodes 7a and 7b starts to be moved downward as from the time the control pulse has gone high in order to transfer the signal charge e accumulated in the potential well below the FG electrode 6 to below the PG electrode 7b during the time the control pulse Pg is at the high level. The effect of capacitive coupling due to parasitic capacitance between the FG electrode 6 and the PG electrode 9a becomes manifest during the delay time t which elapses since the control pulse Pg goes high until the reset pulse Pr goes high, as shown in FIGS. 2A–2C, so that a noise N due to the potential shift is superimposed on the output signal S. Since such noise N incur serious deterioration in the playback picture quality, it becomes necessary to provide a noise suppressing circuit, thereby complicating the circuit construction.

Another conventional charge transfer device, shown in FIG. 3, has a p-type silicon substrate, for example, not shown, on which are formed a charge transfer section 31 for sequentially transferring signal charges e and a charge detection section 32 for detecting signal charges e transferred on the charge transfer section 31.

The signal transfer section 31 is of a two-phase drive transfer system in which the signal charges e are transferred using two-phase clock pulses $P_1$, $P_2$ oppositely phased relative to each other.

The charge detecting section 32 is constituted by a floating gate amplifier for non-destructively detecting signal charges transferred from the charge transfer section 31. The floating gate amplifier includes an output gate OG adjacent to the last stage of the charge transfer section 31, a floating gate FG, a discharging element 33, made up of a pre-charge gate PG and a drain region D, and a source follower circuit 34, made up of an output device Q1 and a load resistor device Q2, on the downstream side of the floating gate amplifier.

The output gate OG has its gate electrode fed with a dc voltage $V_{og}$, while the precharge gate has its gate electrode supplied with a control pulse $\Phi_{pg}$. The signal charge transferred from the charge transfer section 31 via the output gate OG and accumulated in the floating gate FG is swept in this manner into the drain region D.

To the gate electrode of the floating gate FG is connected a switching transistor Tr fed with the reset pulse Pr and with a resetting source voltage Vr coupled to its drain terminal.

The aforementioned reset pulse Pr is fed to the gate electrode of the switching transistor Tr for fixing the potential below the floating gate electrode at a Vr level. A voltage changes ΔV is supplied to the downstream side source follower circuit 34 by the signal charges transferred to and accumulated below the floating gate electrode, and is outputted as an output voltage (image signal) S at an output terminal $\Phi_0$ of the source follower circuit 34.

However, with the above-described charge transfer device, since the voltage $V_{og}$ applied to the output gate OG is a fixed voltage, the parasitic capacitance between the floating gate FG and the output gate OG acts as hindrance to improvement in the charge-voltage conversion efficiency.

SUMMARY OF THE INVENTION

It is an object of the present invention to provide a charge transfer device which can be reduced in size and improved in performance without increasing the number of electrodes or without complicating its construction.

It is a further object of the present invention to provide a charge coupling device applied to a charge transfer stage inclusive of the output stage of, for example, the CCD solid state imaging device, in which the effect of capacitive coupling between the FG electrode and the PG electrode on the output signal may be suppressed for improving the output picture quality.

It is a further object of the present invention to provide a charge coupling device in which the parasitic capacitance between the floating gate FG and the output gate OG may be diminished and the gate of the charge transfer channel 3 may be isolated from the floating gate FG, such that it becomes possible to improve the charge voltage conversion efficiency in the floating gate FG and the sensitivity of the solid-state imaging device as well as the S/N ratio.

It is another object of the present invention to provide a charge transfer device in which a potential deeper than the potential well below the FG electrode may be produced below the PG electrode without interposition of a booster circuit for boosting the voltage supplied to the PG electrode.

With the charge transfer device according to the present invention, first and second output gate electrodes are provided between the charge transfer stage and the charge accumulating stage. The first output gate electrode is driven at a constant voltage and fed back to the second output gate electrode of the charge accumulating section via a feedback channel. In this manner, the second output gate electrode is driven by an imaging signal S which is in phase with a voltage change ΔV in the charge storage section. Since the floating gate may be isolated in this manner from the gate of the charge transfer section, it becomes possible to improve not only the charge-voltage conversion efficiency in the floating gate but also the S/N ratio and sensitivity of the solid-state imaging device.

With the charge transfer device of the present invention, an output gate electrode is provided between the charge transfer stage and the charge accumulating stage. The output gate electrode has extensions along both longitudinal sides of the charge accumulating section. The parasitic capacitance between the floating gate and the output gate may be diminished, while the S/N ratio as well as sensitivity of the solid-state imaging device may be improved.

With the charge transfer device of the present invention, a floating gate electrode is arranged on the charge accumulating section via an insulator. The floating gate electrode has portions facing the output gate surrounding the floating gate electrode. Consequently, the floating gate electrode may be separated from the gate of the charge transfer section, resulting in improvement in the charge-voltage conversion efficiency in the floating gate, sensitivity of the solid-state imaging device and in the S/N ratio.

In addition, with the charge transfer device of the present invention, the distance between the extensions of the output gate electrode and the facing portions of the floating gate electrode is set so as to be larger than the distance between the floating gate electrode and the substrate, so that the capacitance between the output gate electrode and the output gate electrode may be reduced to a value significantly smaller than the capacitance between the channel stop and the floating gate electrode. Consequently, the floating gate and the gate of the charge transfer section may be separated from each other, resulting in further improvement in the charge-voltage conversion efficiency in the floating gate, sensitivity of the solid-state imaging device and in the S/N ratio.

Furthermore, with the charge transfer device of the present invention, the potential in the charge-voltage conversion section is designed to be shallower than that in the precharge gate when the charge-voltage conversion section is at the same voltage level as the precharge gate. This enables the voltage to be applied to the charge-voltage conversion section and the precharge gate from the same voltage source even if a booster circuit is not connected to the precharge gate.

Specifically, if it is desired that the potential in the charge-voltage conversion section be shallower than that in the precharge gate, it may be contemplated to lower the concentration of the N-type impurity diffused into the channel region in the charge-voltage converting section to a value smaller than the concentration of the N-type impurity diffused into the channel region in the precharge gate.

In order to provide for different N-type impurity diffusion concentrations in the channel region, usually the N-type impurity is ion-implanted on the surface of the P-type silicon substrate for generating an N-type impurity diffusion region of high impurity concentration (N-region). A first-layer electrode is patterned on the silicon substrate carrying the N-region. Then, using the first-layer electrode layer as a mask, a P-type impurity is ion-implanted on the silicon substrate surface for selectively forming an N-type impurity diffusion region of low impurity concentration (N region). A second-layer electrode is then formed via a gate insulating film for forming a lower-layer electrode on the N-region channel region and an upper-layer electrode on the N⁻ region channel region.

Consequently, if the electrode constituting the charge-voltage conversion section is formed at a height level higher than the electrode layers constituting the output gate and the precharge gate, a P-type impurity may be ion-implanted into the channel region below the electrode constituting the charge-voltage conversion section, thus making it possible to form an N-type impurity diffusion region (N region) lower in concentration than the channel region in the precharge gate.

Thus the potential in the precharge gate may be rendered deeper than that in the charge-voltage conversion section.

Also, with the charge transfer device of the present invention, the voltage in the channel region in the precharge gate is designed to exhibit a downward gradient in the charge transfer direction by selective impurity introduction, as a result of which the signal charge e stored in a potential well in the charge-voltage conversion scion may be smoothly transferred towards the drain region after riding over a potential barrier in a precharge gate neighboring to the charge voltage converting section.

Finally, with the charge transfer device of the present invention, a resetting operation by application of a reset pulse Pr is performed after the signal charge e transferred from the charge transfer section 3 is taken as a voltage signal in the charge-voltage conversion section and before transfer of the signal charge e to the next stage by application of a control pulse Pg.

By the resetting operation, the voltage level in the charge-voltage conversion section is fixed, as a result of which the parasitic capacity between the charge-voltage converting section and the precharge gate becomes equivalently null. Consequently, even if the potential below the precharge gate is fluctuated by the application of the control pulse Pg during the subsequent transfer of the signal charge to the next stage by the application of the control pulse, there is only little effect of the capacitive coupling of the parasitic capacitance on the charge-voltage converting section.

It will be seen that, if the charge transfer device according to the present invention is applied to, for example, a charge transfer stage including the output unit of the CCD solid-state imaging device, any adverse effects on the output signal S of the capacitive coupling of the parasitic capacitance between the charge-voltage converting section and the precharge gate may be suppressed, thereby improving the playback picture quality.

BRIEF DESCRIPTION OF THE DRAWINGS

FIGS. 12A and 12B are a timing chart showing two-phase driving pulses applied to a transfer electrode in the charge transfer section of the charge transfer device according to the fourth embodiment.

FIGS. 13A and 13B are a timing chart showing the control pulse and the reset pulse, applied to the pre-charge gate electrode (PG electrode) and to the gate electrode of a switching transistor of the charge transfer device of the fourth embodiment.

DESCRIPTION OF THE PREFERRED EMBODIMENTS

Figure 1:
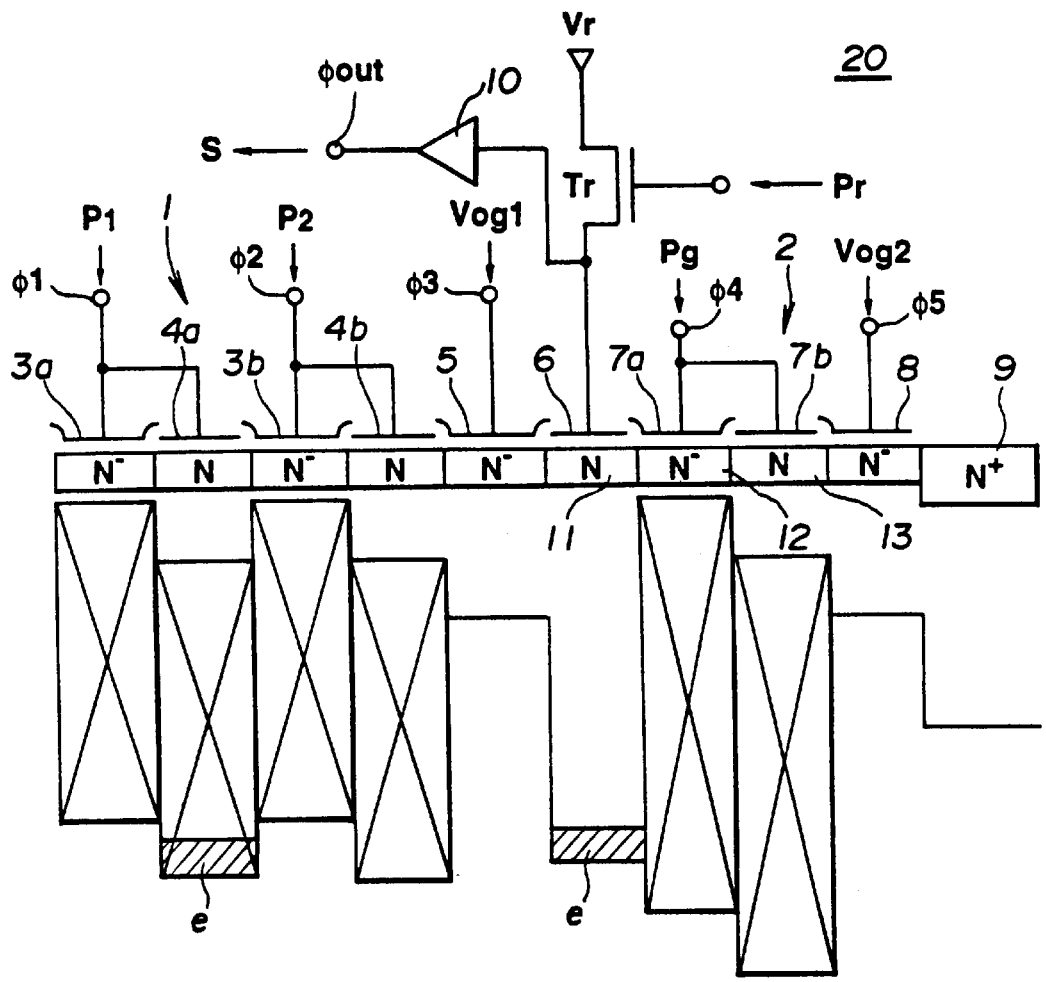
FIG. 1 schematically shows a conventional charge transfer device along with the potential in the vicinity of a floating gate amplifier.
Figure 2A:
FIGS. 2A–2C are a timing chart showing the control pulse and the reset pulser applied to the pre-charge gate electrode (PG electrode) and to the gate electrode of a switching transistor of a conventional charge transfer device, along with an output signal 1 waveform.
Figure 2B:
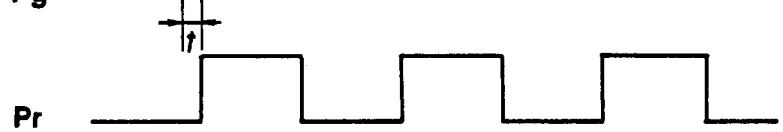
Figure 2C:
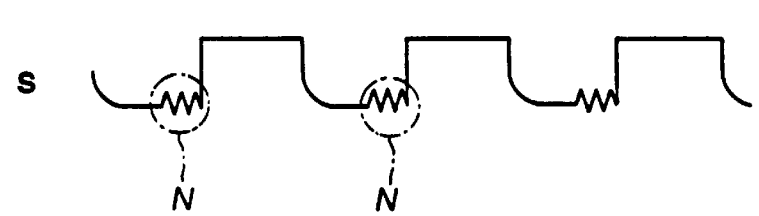
Figure 3:
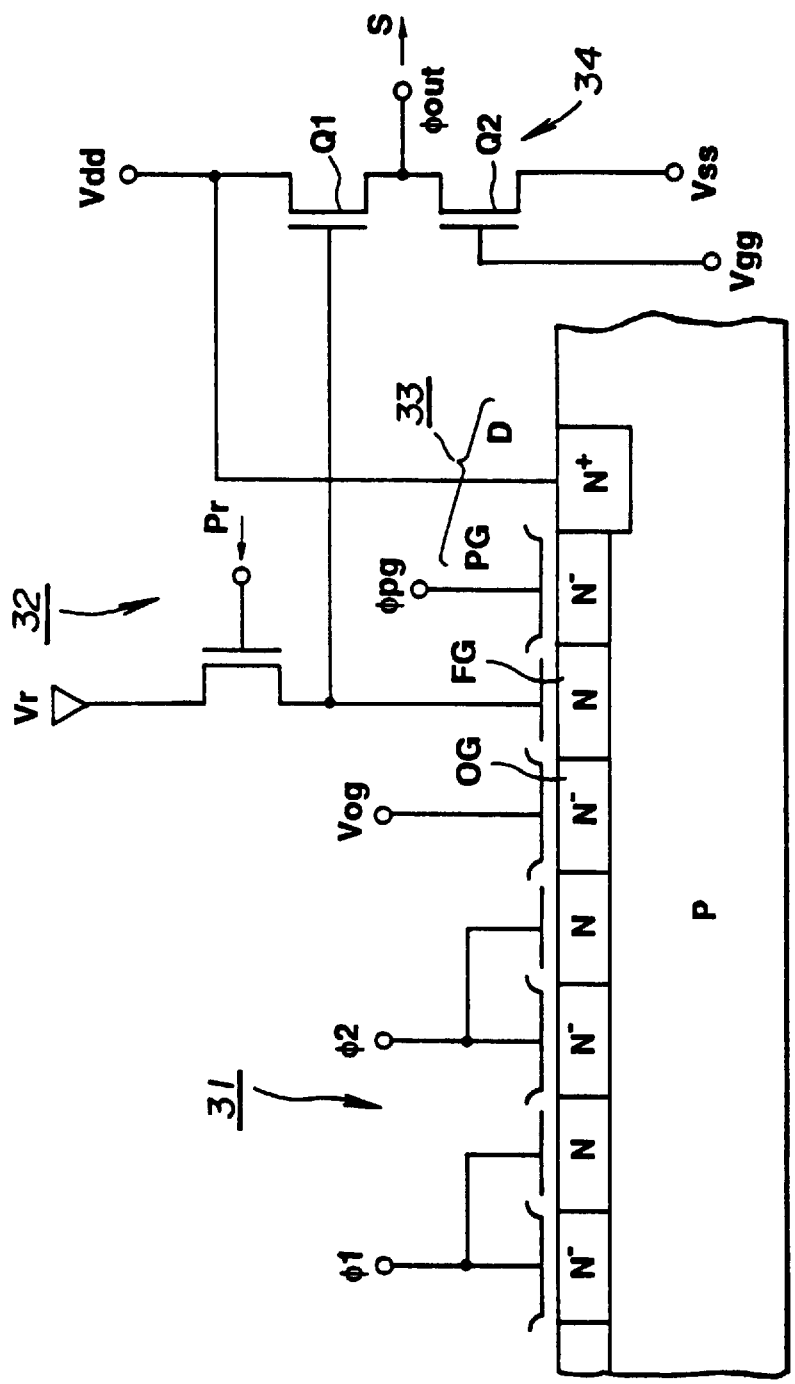
FIG. 3 shows an output section of another conventional charge transfer device.

Referring to the drawings, preferred embodiments of the present invention will be explained in detail. First, a charge transfer device according to a first embodiment will be explained.

Figure 4:
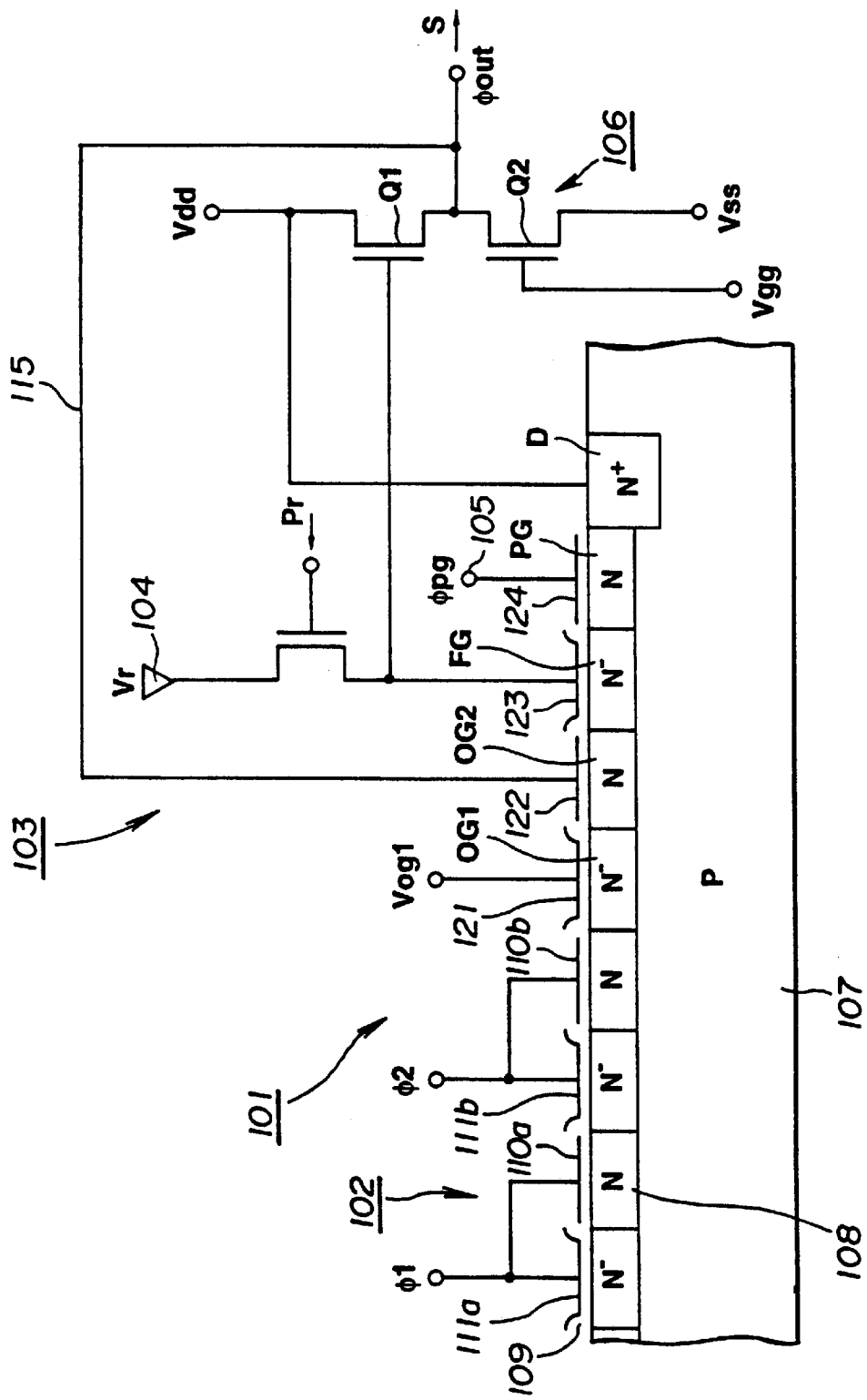
FIG. 4 schematically shows an arrangement of a charge transfer device according to a first embodiment of the present invention.

An output unit 101 of the charge transfer device according to the first embodiment shown in FIG. 4 has a P-type silicon substrate, for example, on which there are formed a charge transfer section 102 for sequentially transferring signal charges and a charge detection section 103 for detecting the signal charges transferred from the charge transfer section 102.

The charge transfer section 102 includes a horizontal resister 108 constituted by a band of an N-type impurity diffusion area on the surface of, for example, a P-type silicon substrate 107, and first and second horizontal transfer electrodes 110, 111. These horizontal transfer electrodes 110, 111 are formed as first and second polycrystal silicon layers, deposited on the horizontal register 108 via an insulating film 109. Two sets of the horizontal transfer electrodes 110, 111, each consisting of one horizontal transfer electrode 110 and one horizontal transfer electrode 111, are arrayed for extending in this order in the horizontal direction. Oppositely phased two-phase driving pulses Φ1 and Φ2 are applied to the sets of the horizontal transfer electrode for sequentially transferring the signal charges towards the output unit 101.

The charge detection section 103 includes a floating gate amplifier 104 for non-destructively detecting signal charges transferred thereto from the charge transfer section 102.

The floating gate amplifier 104 includes first and second output gates OG1 and OG2, formed adjacent to the final stage of the charge transfer section 102, a floating gate FG, a discharging device 5, consisting of a pre-charge gate PG and a drain region D, and a source follower circuit 6. The source follower circuit is connected to the downstream side of the discharging device and made up of an output device Q1 and a load resistor device Q2. The output device Q1 and the load resistor device Q2 are constituted by, for example, N-channel type MOS field effect transistors (MOSFETs).

A dc voltage $V_{OG}1$ is supplied to a gate electrode 121 of the first output gate OG1, while a control pulse Φpg is supplied to a gate electrode 124 of the precharge gate 124. In this manner, the signal charge transferred from the charge transfer section 102 via the first and second output gates OG1, OG2 so as to be stored in the floating gate FG is swept into the drain region D.

To the gate electrode 123 of the floating gate FG is connected a switching transistor Tr fed with the reset pulse Pr and with a resetting source voltage Vr coupled to its drain terminal. The aforementioned reset pulse Pr is fed to the gate electrode of the switching transistor Tr for fixing the potential below the floating gate electrode at a Vr level. Besides, the voltage change ΔV by the signal charges transferred to and accumulated in a region below the gate electrode 123 of the floating gate FG is supplied to a downstream side source follower circuit 106 so as to be outputted at an output terminal Φout of the source follower circuit 106 as an output voltage (image signal) S.

Figure 5A:
FIGS. 5A–5C are a waveform diagram showing output timings of a two-phase driving pulse and a reset pulse in the first embodiment.
Figure 5B:
Figure 5C:

The output timings of the two-phase driving pulses Φ1 and Φ2 are shown in FIGS. 5A and 5B.

Figures 6A, 6B:
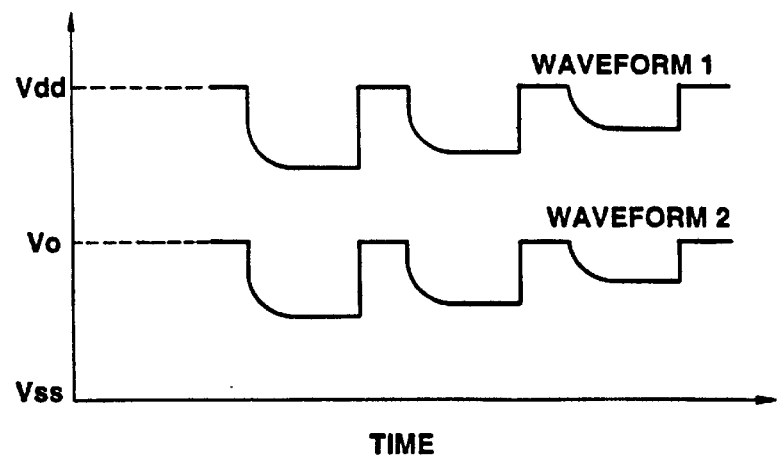
FIGS. 6A and 6B are a waveform diagram showing the relation between voltage changes from the floating gate in the first embodiment and an output signal from the source follower circuit.

Thus the voltage change ΔV, taken at the gate electrode 123 of the floating gate FG, becomes a signal containing signal components which are based on the accumulated charges and the precharge drain voltage Vdd, as shown by a waveform 1 in FIGS. 6A and 6B. If the gain of the source follower circuit 106 is G. where $0.7<G\leq1$, an output signal S from the source follower circuit 106 corresponds to a signal equal to the voltage change ΔV, as taken from the gate electrode 123 of the floating gate FG and multiplied by G, with the voltage change ΔV and the output signal S being in phase with each other.

Turning to the output signal S from the source follower circuit 106, a voltage corresponding to the precharge voltage Vdd from which the voltage change ΔV taken out at the gate electrode 123 is changed is VO, with the magnitude relation being given by Vo<Vdd because of the magnitude of the gain G of the source follower circuit 106.

In the present embodiment, there is provided a feedback channel 115, interconnecting an output of the source follower circuit 106 and the gate electrode 22 of the second output gate OG2, for feeding the output signal (image signal) S outputted from the source follower circuit 106 back to the gate electrode 122 of the second output gate OG2. In this case, since the signal in phase with the voltage change ΔV taken out from the gate electrode 123 of the floating gate FG is supplied to the gate electrode 122 of the second output gate OG2, the parasitic capacitance between the floating gate FG and the second output gate OG2 is diminished.

In effect, with the gain G of the source follower circuit 106, the parasitic capacitance between the floating gate FG and the second output gate OG2 may be diminished by a factor of (1-G). It may be seen from this that, if, as an ideal case, the gain G of the source follower circuit 106 is approached to unity by changing the bias voltage Vgg applied to the gate of the load resistor device Q2 of the source follower circuit 106 for approaching the difference between the voltage change ΔV taken out at the gate electrode of the floating gate FG and the output signal S of the source follower circuit 106 to zero, it becomes possible to diminish the parasitic capacitance between the floating gate FG and the second output gate OG2 equivalently to zero.

With the above-described first embodiment, in which the output of the source follower circuit 106, that is the image signal S, is fed back to the source electrode 122 of the second output gate OG2, it becomes possible to diminish the parasitic capacitance between the floating gate FG and the second output gate OG2. Since the output gate is of a dual stage construction, the floating gate may be isolated from the gate of the charge transfer section. That is, by applying a dc bias to the first output gate OG1, it becomes possible to prevent capacitive coupling of the driving pulse $\Phi 2$ to the second output gate OG2. Thus it becomes possible to improve the charge-voltage conversion efficiency in the floating gate FG and hence to improve sensitivity of the solid-state imaging device and the S/N ratio.

A charge coupling device according to a second embodiment of the present invention is hereinafter explained.

In the above-described first embodiment, the output of the source follower circuit 106 is fed back to the gate electrode 122 of the second output gate OG2 via a feedback path 115. In the present second embodiment, the feedback path 115 is omitted, and the second output gate OG2, provided adjacent to the first output gate OG1, is arranged as shown in FIG. 7 for driving the device at a constant voltage.

The parts or components having the similar manner of operation as those of the first embodiment are correspondingly numbered and the detailed description therefor is not made herein.

Figure 7:
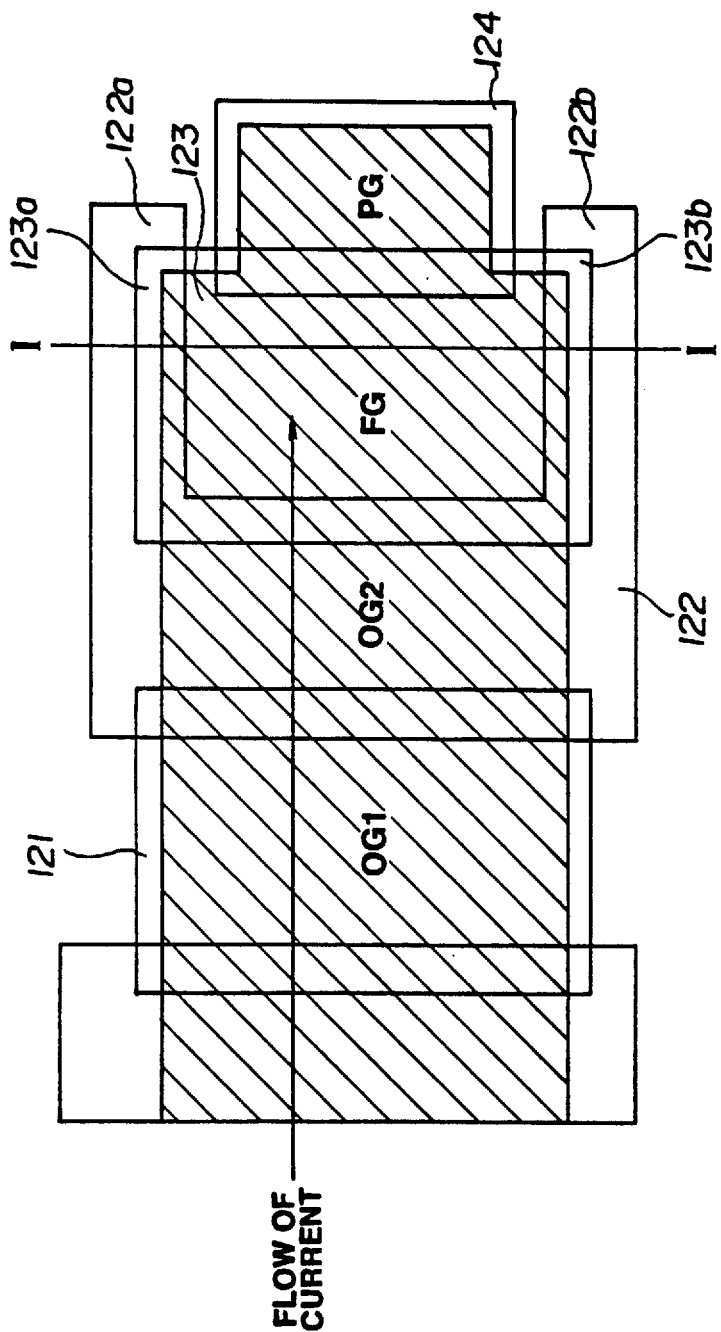
FIG. 7 schematically shows an arrangement of a charge transfer device according to a second embodiment of the present invention.
Figure 8:
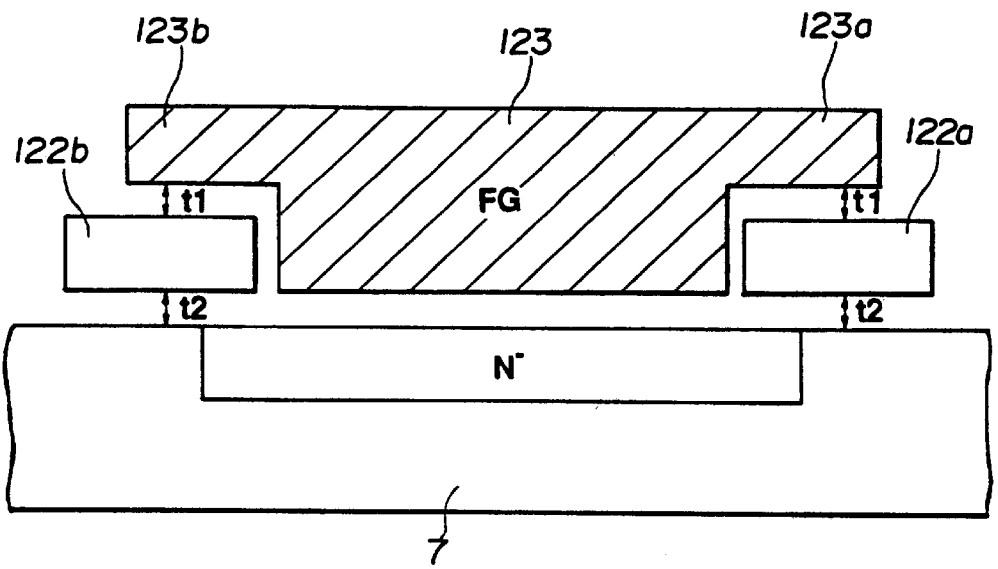
FIG. 8 is a cross-sectional view taken along line I—I of FIG. 7, showing a second output gate of the charge transfer device shown in FIG. 7.
Figure 9:
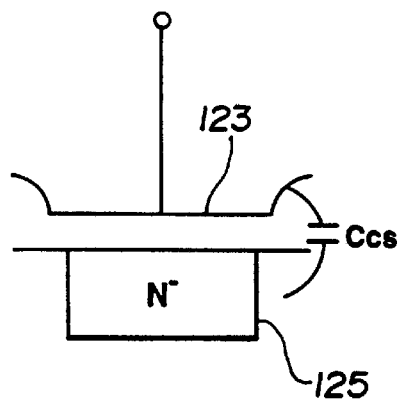
FIG. 9 schematically shows the capacity between the channel stop and the floating gate in the second embodiment.

In FIG. 7, the gate electrode 122 of the second output gate OG2 of the solid-state imaging device of the second embodiment has extensions 122a, 122b extending along both longitudinal sides of the gate electrode 23 of the floating gate FG, while the gate electrode 123 of the floating gate FG has portions 123a, 123b facing the extensions 122a, 122b of the gate electrode 122 of the second output gate OG2, respectively. Specifically, the extensions 122a, 122b of the gate electrode 22 of the second output gate OG2 are arranged so that a distance $t_2$ thereof from the substrate 107 is smaller than a distance $t_1$ thereof from the facing portions 123a, 123b of the gate electrode 123 of the floating gate FG.

Thus the capacitance between the gate electrode 122 of the second output gate OG2 and the gate electrode 123 of the floating gate FG can be made significantly smaller than the capacity Ccs between the channel stop 125 and the gate electrode 123 of the floating gate FG. In addition, since the output gate is of the dual stage structure, the floating gate FG can be isolated from the gate of the charge transfer section. Consequently, the parasitic capacitance between the floating gate FG and the second output gate OG2 and the total capacitance about the floating gate FG can be diminished, thereby improving the charge-voltage conversion characteristics in the floating gate FG and hence the sensitivity of the solid-state imaging device and the S/N ratio.

Although the first and second output gates are provided in the above-mentioned second embodiment between the charge transfer section and the charge storage section, similar effects may be derived when the first output gate is omitted, that is when there is provided only one output gate having extensions along both longitudinal sides of the charge storage section.

A charge coupling device according to a third embodiment of the present invention is hereinafter explained.

In the above-described second embodiment, the second output gate OG2 is driven at a constant voltage. With the charge transfer device of the present third embodiment, there is provided a feedback channel of feeding an output of the source follower circuit 6 in the second embodiment to the gate electrode 122 of the second output gate OG2.

In such case, the second output gate OG2 is fed with a signal in phase with the voltage change $\Delta V$ taken out at the gate electrode of the floating gate FG. On the other hand, the capacitance between the gate electrode 122 of the second output gate OG2 and the gate electrode 123 of the floating gate FG can be made significantly smaller than the capacitance between the channel stop 125 and the gate electrode 123 of the floating gate FG. Besides, since the output gate is of a dual stage construction, the floating gate can be isolated from the gate of the charge transfer section. Consequently, the parasitic capacitance between the floating gate FG and the second output gate OG2 and the total capacitance about the floating gate FG can be diminished. The result is the improved charge-voltage conversion characteristics in the floating gate FG, sensitivity of the solid-state imaging device and S/N ratio.

In the above-described second embodiment, the distance t2 of the extensions 122a, 122b of the gate electrode 22 of the second output gate OG2 from the substrate is set so as to be smaller than the distance t1 thereof from the facing portions 123a, 123b of the gate 123 of the floating gate electrode FG. In the third embodiment, the distances t1 and t2 are set so as to be equal (t1=t2) or the distance t2 is set so as to be larger than the distance t1 (t1<t2) with similar favorable results.

In addition, in the above-described second embodiment, the output unit 101 is designed so that the voltage change $\Delta V$ taken out at the gate electrode 123 of the first to third floating gates FG is amplified by the source follower circuit 5 made up of the output device Q1 and the load resistor device 02. However, the source follower circuit 106 is given only by way of illustration and the present invention may be applied to any voltage follower type amplifiers.

Furthermore, the foregoing description has been made of a case wherein the impurity diffusion region constituting the charge transfer section 2 is of the N type, so that the carriers as the signal charges are electrons. However, the present invention may also be applied to a case in which the impurity diffusion region constituting the charge transfer section 102 is of the P type and the carriers as signal charges are positive holes.

The above-described first and second embodiments of the present invention may be applied to a floating diffusion amplifier with similar favorable result.

Figure 10:
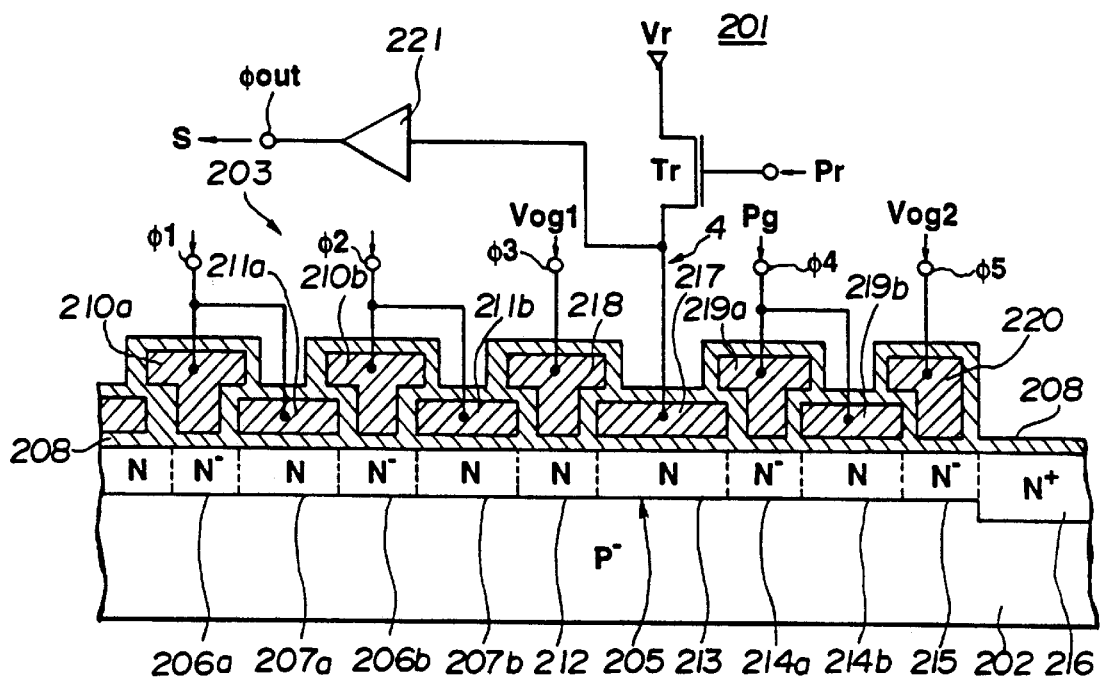
FIG. 10 is a cross-sectional view schematically showing a charge transfer device according to a fourth embodiment of the present invention.

A charge transfer device 201 according to a fourth embodiment of the present invention includes a P-type silicon substrate, for example, as a substrate, on which are formed an input unit, not shown, a charge transfer section 203 for sequentially transferring signal charges sent from the input unit, and a charge detection section 204 for detecting the signal charges transferred on the charge transfer section 203, as shown in FIG. 10. The silicon substrate may also be a well region, if desired. The input unit is of any known construction permitting the signal charges to be sent to the charge transfer section 203.

The charge transfer section 203 is of a two-phase drive transfer system in which signal charges are transferred using oppositely phased driving pulses $P_1$, $P_2$, as shown for example in FIGS. 12A and 12B.

Figure 11:
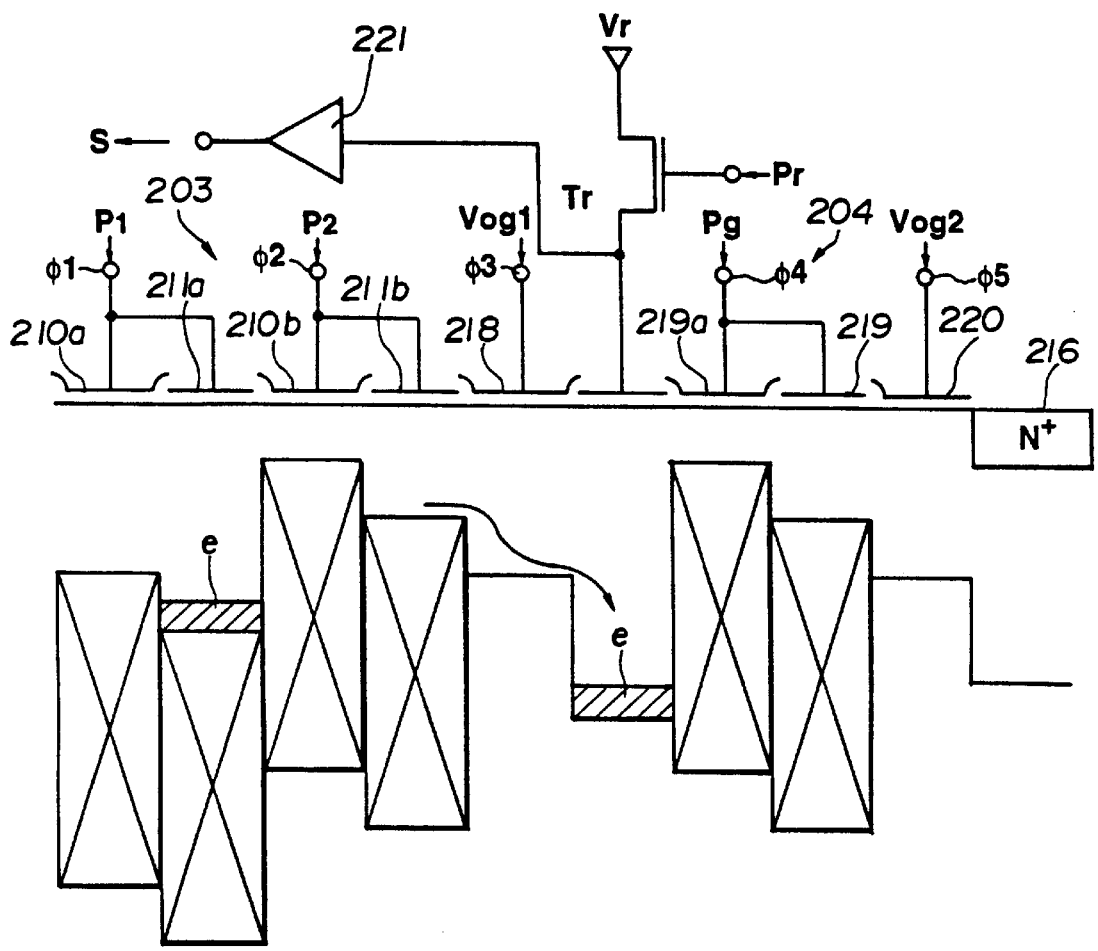
FIG. 11 schematically shows the potential in the vicinity of a floating gate amplifier of the charge transfer device of the fourth embodiment.

That is, as shown in part in FIGS. 10 and 11, transfer gate regions (TG regions) 206a, 206b, formed by N-type impurity diffusion regions of low impurity concentration, and storage gate regions (SG regions) 207a, 207b, formed by N-type impurity diffusion regions of high impurity concentration, are alternately arrayed in contiguity to one another in one direction on the surface portion of a silicon substrate 202. These gate regions serve as transfer channels for the signal charges.

By the difference in the concentration between the N-type impurity diffusion regions 206a, 206b (TG regions) and the N-type impurity diffusion regions 207a, 207b (SG regions), the potentials of the TG regions and the SG regions are at the low level and at the high level, respectively, under the state of thermal equilibrium, as shown in FIG. 11. That is, a step-shaped potential descending in the direction of the charge detection section 204 is formed between the TG regions 206a, 206b and the SG regions 207a, 207b.

On the charge transfer channel region 205, TG electrodes 210a, 210b formed by, for example, a second layer of a polycrystal silicon layer, and SG electrodes 211a, 211b formed by a first layer of a polycrystal silicon layer, are deposited with the interposition of a gate insulating film 208 formed e.g. of $SiO_2$. That is, a large number of sets of transfer electrodes are arrayed for extending in one direction, with each such set consisting of a TG electrode 210 deposited in register with the underlying TG region 206 and a SG electrode 211 deposited in register with the underlying SG layer 207.

One $P_1$ of the driving pulses is supplied via an input terminal Φ1 to the TG electrodes 210a and the SG electrodes 211a of the odd numbered set, while the other driving pulse $P_2$ is supplied via an input terminal Φ2 to the TG electrodes 210b and the SG electrodes 211b of the even numbered set, whereby the signal charge e is transferred by the two-phase drive system towards the charge detection section 204.

That is, by the two-phase driving pulses $P_1$, $P_2$ being applied to the odd-numbered set of the transfer electrodes 210a, 210b and the even-numbered set of the transfer electrodes 211a, 211b, respectively, the signal charge e transferred from the input unit, not shown, is sequentially transferred on the charge transfer channel region 205 of the charge transfer section 203, that is on the odd-numbered set of the TG region 206a and the SG region 207 and the even-numbered set of the TG region 206b and the SG region 207b, due to the difference in the potential between the TG region 206 and the SG region 207.

The charge detecting section 204 is constituted by a floating gate amplifier for non-destructively detecting the signal charge e transferred from the charge transfer section 203.

That is, there is formed, next to the SG region 207b, as the final stage of the charge transfer section 203, an N-type floating gate electrode (FG electrode) 213, with an N-type first output gate (first OG) 212 in-between. Next to the FG region 213 are formed N-type precharge gate regions (FG regions) 214a, 214b. Similarly to the TG region and the SG region in the charge transfer section, one of the PG regions adjacent to the FG region is formed by an N-type impurity diffusion region of low impurity concentration, while the other PG region is formed by a N-type impurity diffusion region of high impurity concentration. Next to the other PG region is formed an N-type drain region 216, with an N-type second output gate region (second OG region) 215 in-between.

In forming the N-type charge transfer channel region, constituting the transfer channel 205, an N-type impurity, such as phosphorus (P), is ion-implanted on the surface of the P-type silicon substrate 202, for forming an N-type impurity diffusion region (N-region) in the charge transfer channel region 205 in its entirety, after which a P-type impurity, such as boron (B), is selectively ion-implanted for forming an N-type impurity diffusion region of the low impurity concentration (N⁻region).

A first FG electrode 217 and a first OG electrode 218, consisting of a first-layer polycrystal silicon and a second-layer polycrystal silicon, respectively, are formed via the gate insulating layer 208 on the FG region 213 and the first OG region 212. A first PG electrode 219a consisting of a second-layer polycrystal silicon and a second PG electrode 219b consisting of a first-layer polycrystal silicon are formed on the PG regions 214a, 214b, respectively, via the gate insulating film 208, while a second OG electrode 220 consisting of a second-layer polycrystal silicon is formed on the second OG region 215 via the gate insulating film 208 for constituting the charge detection section 204.

In this case, dc voltages Vog1 and Vog2 are supplied via input terminals Φ3 and Φ5 to the first OG electrode 218 and the second OG electrode 220, respectively, so that fixed potential barriers are formed below the first and second OG electrodes 218, 220, respectively. On the other hand, the FG electrode 217 is connected to an output terminal bout via an amplifier 221 consisting of, for example, a source follower circuit, formed on the same silicon substrate 2. The FG electrode 217 is connected to a source of a switching transistor Tr, which is a N-channel MOS transistor and which has its gate electrode and its drain terminal supplied with a reset pulse Pr and the resetting source voltage Vr, respectively. The PG electrodes 219a, 219b are supplied with a control pulse Pg, as later described, via an input terminal Φ4.

When the reset pulse Pr is applied to the gate electrode of the switching transistor Tr, the transistor Tr is turned on for fixing the FG electrode 217 at the source voltage level Vr. At this time, the potential below the FG electrode 217 is raised to a level corresponding to the source voltage level Vr, so that a potential well is formed below the FG electrode 217. That is, the reset pulse Pr is applied for resetting the FG electrode 217. The switching transistor Tr is then turned off so that the FG electrode 217 is in the floating state.

If the signal charge e is transferred from the last stage of the charge transfer section 203 to the FG region below the FR electrode 217, a voltage change corresponding to the amount of the transferred signal charge e is produced in the FG electrode 217. This voltage change is amplified by a downstream side amplifier 221 so as to be outputted at the output terminal Φout as the output signal S.

If the control pulse Pg is applied to the PG electrodes 219a, 219b whist the signal charge e is accumulated below the FG electrode 217, the potential below the PG electrodes 219a, 219b becomes high, with the potential barrier below the PG electrode 219a becoming lower than the potential well below the FG electrode 217. At this time, the signal charge e accumulated in the potential well below the FG electrode 217 is transferred to below the other PG electrode 219b over the potential barrier below the PG electrode 219a.

When the control pulse Pg ceases to be supplied to the PG electrodes 219a, 219b, the potential below the PG electrodes 219a, 219b become low, so that the potential below the PG electrodes 219a, 219b becomes lower, and hence the initial state is reached, that is, the potential barrier below the other PG electrode 219b becomes higher than the potential barrier below the adjacent second OG electrode, as shown in FIG. 11. At this time, the signal charge e accumulated below the other second PG electrode 219b is swept to the adjacent drain region 216 over the potential barrier below the second OG electrode 220.

In the present embodiment, the output timings of the reset pulse Pr and the control pulse Pg are set in the following manner. That is, the start time of the resetting of the FG electrode 217 by the reset pulse Pr is set so as to be earlier than the start time of the transfer operation of the signal charge e by the control pulse Pg to below the PG electrodes 219a, 219b by a time t, as shown in. FIGS. 13A and 13B, where 0<t<T/2, T being a pulse width of the reset pulse Pr. In addition, the resetting end time of the resetting of the FG electrode 217 by the reset pulse Pr is set so as to be later by the time t than the end time of the transfer operation of transferring the signal charge e to below the PG electrodes 219a, 219b by the control pulse Pg. By setting the output timings of the reset pulse Pr and the control pulse Pg in this manner, the control pulse Pg is applied to the PG electrodes 219a, 219b while the FG electrode 217 is set to the fixed source voltage level Vr by the reset pulse Pr being applied to the gate electrode of the switching transistor Tr. In this manner, the signal charge e is transferred to below the PG electrodes 219a, 219b.

That is, even although the control pulse Pg is applied to the PG electrodes 219a, 219b so that potential fluctuations are produced below the electrodes 219a, 219b, since the FG electrode 217 is fixed at the source voltage level Vr, there is equivalently no parasitic capacitance between the FG electrode 217 and the PG electrodes 219a, 219b, so that the effect of capacitive coupling of the parasitic capacitance to the FG electrode 217 is reduced. Meanwhile, the pulse width T of the reset pulse Pr is the same as that of the reset pulse hitherto used.

Figure 14:
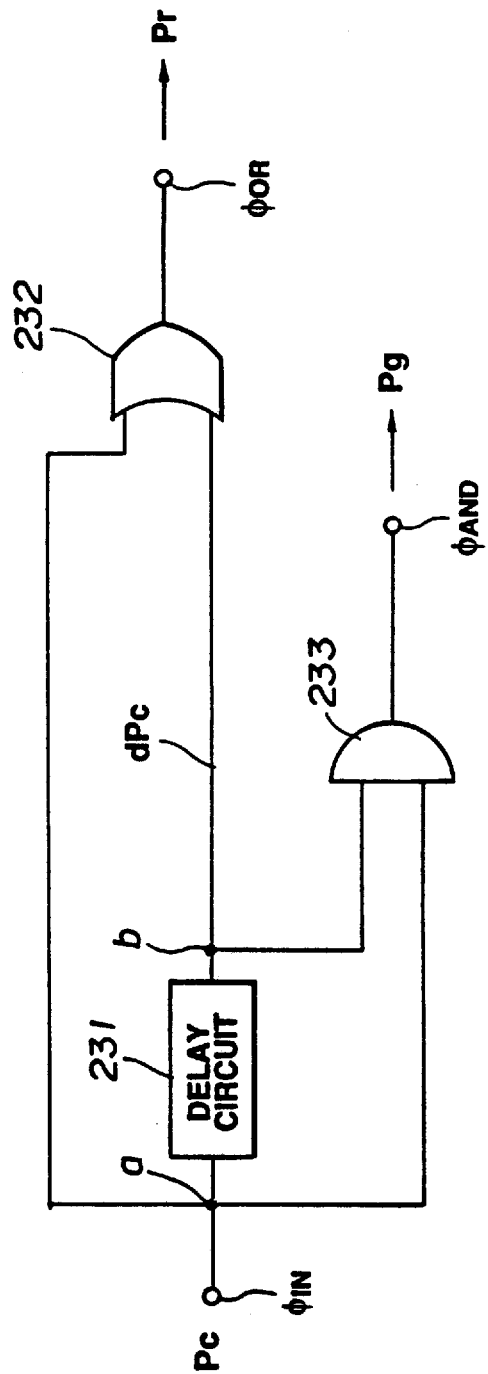
FIG. 14 is a circuit diagram showing a pulse generating circuit for generating the control pulse and the reset pulse, applied to the pre-charge gate electrode (PG electrode) and to the gate electrode of a switching transistor of the charge transfer device of the fourth embodiment.

An illustrative circuit for generating the reset pulse Pr and the control pulse Pg is explained with reference to FIG. 14.

This pulse generating circuit includes a delay circuit 231, made up of an array of, for example, CMOS inverters, and a two-input OR gate 232 and a two-input AND gate 233 connected to the downstream side of the delay circuit 231 via an output node b. The delay circuit 231 is connected via an input node a to the downstream side of an input terminal Φin fed with a reference clock Pc from outside. The input node a is connected to one input terminals of the OR gate 232 and the AND gate 233, while the output node b is connected to the other input terminals of the OR circuit 232 and the AND circuit 233.

Figures 15A, 15B, 15C, 15D, 15E:
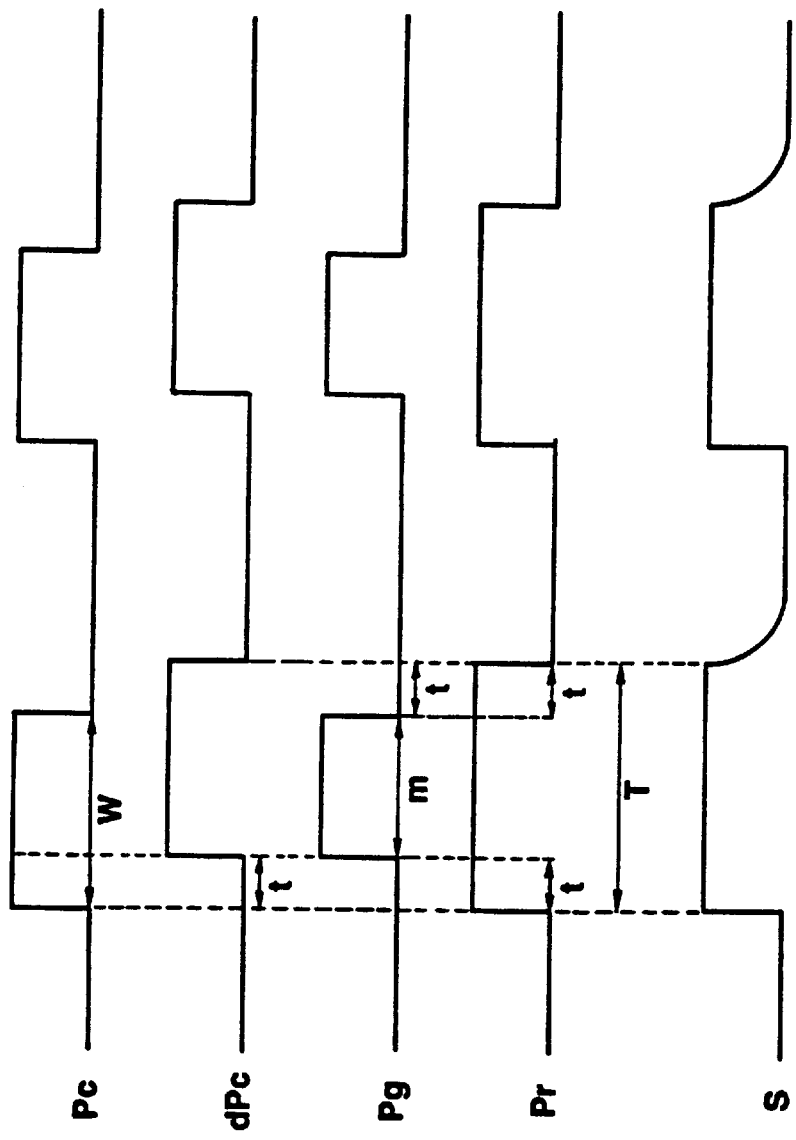
FIGS. 15A–15E are a timing chart showing the signal processing operation of the pulse generating circuit along with the output signal waveform.

The signal processing by the pulse generating circuit is explained with reference to a timing chart of FIG. 15. When the reference clock Pc having a pulse width W (<T) enters the input terminal Φin from outside, the aforementioned reference clock Pc enters the one input terminals of the OR gate 232 and the AND gate 233, while a delayed signal dPc from the delay circuit 231 enters the other input terminals of the OR circuit 232 and the AND circuit 233. The delay signal corresponds to the reference clock Pc delayed by time t.

The OR circuit 232 outputs at its output terminal $\Phi_{OR}$ a pulse signal represented by a logical sum of the reference clock Pc and the delayed signal Dpc, that is the reset pulse Pr which goes high and low at the rise time of the reference clock Pc and at the decay time of the delayed signal Dpc, respectively, and which has a pulse width T (=W+t). On the other hand, the AND circuit 233 outputs at its output terminal $\Phi_{AND}$ a pulse signal represented by a logical product of the reference clock Pc and the delayed signal Dpc, that is the control pulse Pg which goes high and low at the rise time of the delayed signal Dpc and at the decay time of the reference clock Pc, respectively, and which has a pulse width m (=T−2t).

This pulse generating circuit is of an extremely simple circuit construction as shown such that it can be formed on the same silicon substrate 202 of the CCD solid-state imaging device.

With the above-described charge transfer device of the present embodiment, the resetting operation for the FG electrode 217 by the application of the reset pulse Pr on the-gate electrode of the switching transistor Tr is executed after the signal charge e transferred from the charge transfer section 3 is taken as a voltage signal at the FG electrode 217 and before the signal charge e is transferred to below the PG electrodes 219a, 219b as a result of application of the control pulse Pg. Since the voltage level of the FG electrode 217 is fixed at the power source level Vr by such resetting operation, there is produced only a small effect of the capacitive coupling of the parasitic capacitance about the FG electrode 217 even although the potential below the PG electrodes 219a, 219b is fluctuated as a result of application of the control pulse Pc during the subsequent stage of transferring of the signal charge e to below the PG electrodes 219a, 219b by the application of the control pulse Pc.

Consequently, if the charge transfer device according to the present embodiment is applied to, for example, the charge transfer stage including the output unit of the CCD solid-state imaging device, the adverse effect on the output signal S of capacitive coupling of the parasitic capacitance across the FG electrode and the PG electrode is suppressed and hence there is no noise component generated in the signal component of the output signal S due to such capacitive coupling, thereby improving the quality of the reproduced picture.

Figure 16:
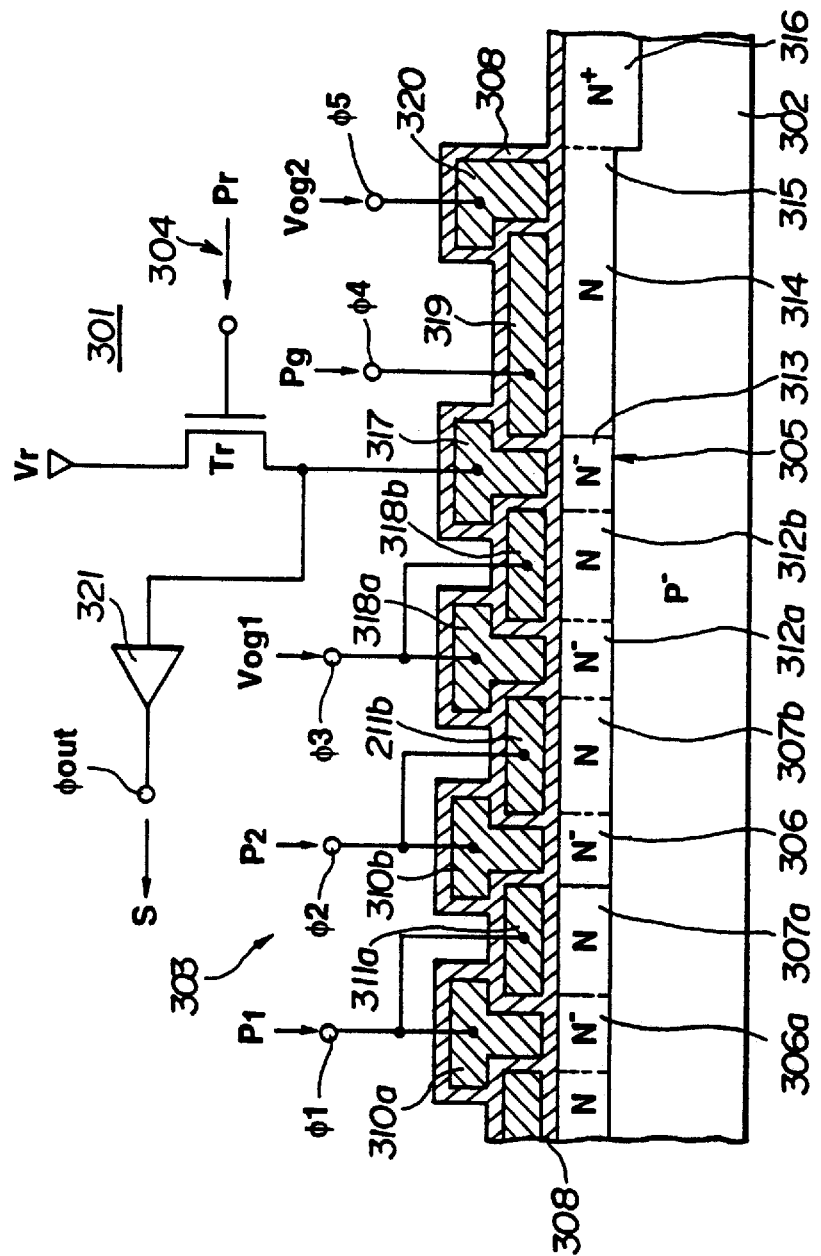
FIG. 16 is a cross-sectional view schematically showing a charge transfer device according to a fifth embodiment of the present invention.

Referring to FIG. 16, a charge transfer device 301 according to a fifth embodiment has a P-type silicon substrate 302, for example, on which there are formed an input unit, not shown, a charge transfer section 303, for sequentially transferring signal charges supplied from the input unit, and a charge detection unit 304 for detecting signal charges transferred by the charge transfer section 303. The silicon substrate may also be replaced by a well region, if desired. The input unit may be of any desired construction if it is capable of supplying the signal charge towards the charge transfer section 303.

The charge transfer section 303 is of the two-phase driving transfer system in which the signal charge is transferred using oppositely phased driving pulses $P_1$ and $P_2$.

Figure 17:
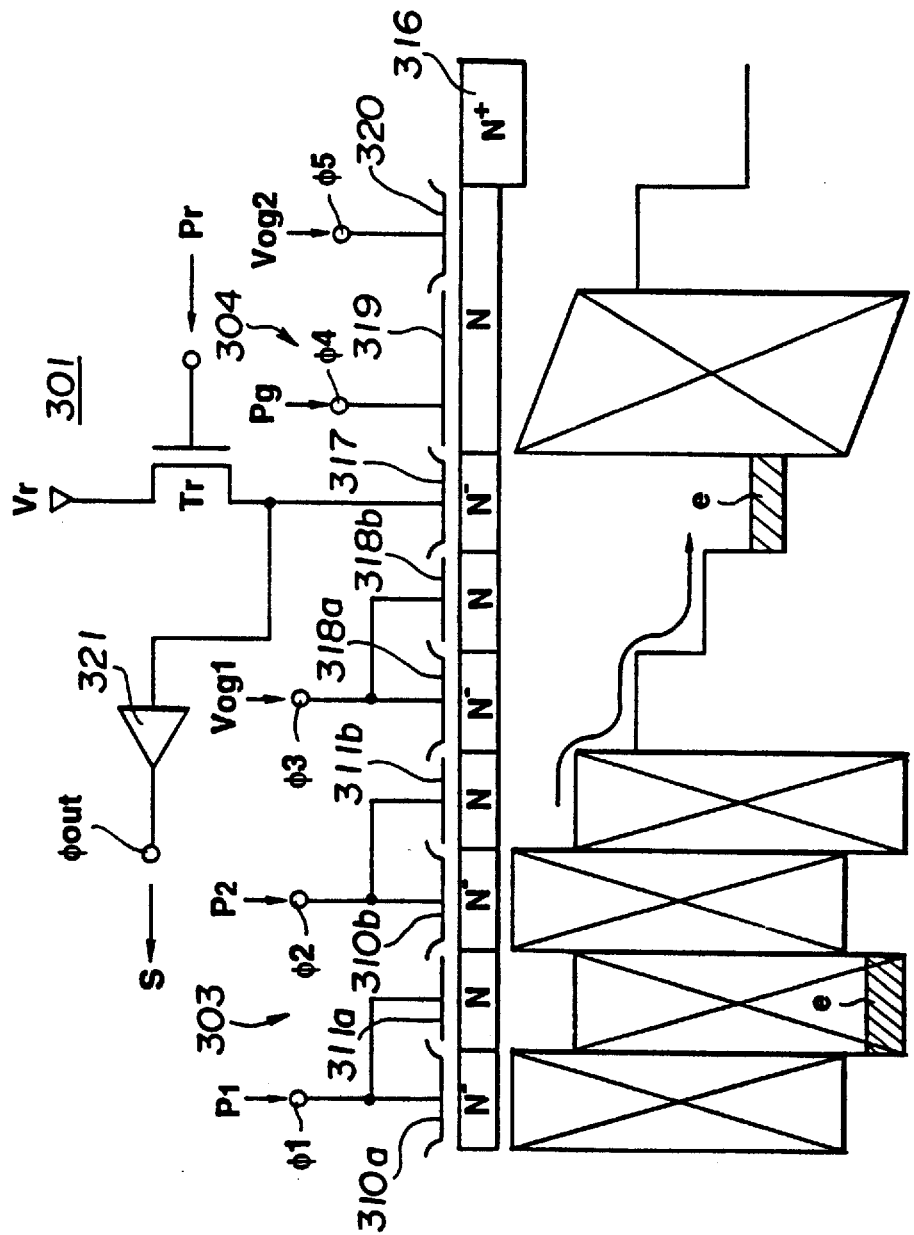
FIG. 17 schematically shows the potential in the vicinity of a floating gate amplifier of the charge transfer device of the fifth embodiment.

That is, as shown in part in FIGS. 16 and 17, transfer gate regions (TG regions) 306a, 306b, formed by N-type impurity diffusion regions of low impurity concentration, and storage gate regions (SG regions) 307a, 307b, formed by N-type impurity diffusion regions of high impurity concentration, are alternately arrayed in contiguity to one another in one direction on the surface portion of the silicon substrate 302. These gate regions serve as transfer channels for the signal charges.

By the difference in the concentration between the N-type impurity diffusion regions 306a, 306b (TG regions) and the N-type impurity diffusion regions 307a, 307b (SG regions), the potentials of the TG regions and the SG regions are at the low level and at the high level, respectively, under the state of thermal equilibrium, as shown in FIG. 17. That is, a stepped potential descending in the direction of the charge detection section 304 is formed between the TG regions 306a, 306b and the SG regions 307a, 307b.

On the charge transfer channel region 305, TG electrodes 310a, 310b formed by, for example, a second layer of a polycrystal silicon layer, and SG electrodes 311a, 311b formed by a first layer of a polycrystal silicon layer, are deposited with the interposition of a gate insulating film 308 formed e.g. of $SiO_2$. That is, a large number of sets of transfer electrodes are arrayed for extending in one direction, with each such set consisting of a TG electrode 310 deposited in register with the underlying TG region 306 and a SG electrode 311 deposited in register with the underlying SG layer 307.

One $P_1$ of the driving pulses is supplied via an input terminal $\Phi 1$ to the TG electrodes 310a and the SG electrodes 311a of the odd numbered set, while the other driving pulse $P_2$ is supplied via an input terminal $\Phi 2$ to the TG electrodes 310b and the SG electrodes 311b of the even numbered set, whereby the signal charge e is transferred by the two-phase drive system towards the charge detection section 304.

That is, by the two-phase driving pulses $P_1$, $P_2$ being applied to the odd-numbered set of the transfer electrodes 310a, 310b and the even-numbered set of the transfer electrodes 311a, 311b, respectively, the signal charge e transferred from the input unit, not shown, is sequentially transferred on the charge transfer channel region 305 of the charge transfer section 303, that is on the odd-numbered set of the TG regions 306a, 306b and the even-numbered set of the SG regions 307a, 307b, due to the difference in the potential between the TG region 306 and the SG region 307.

The charge detecting section 304 is constituted by a floating gate amplifier for non-destructively detecting the signal charge e transferred from the charge transfer section 303.

That is, there is formed, next to the SG region 307b, as the final stage of the charge transfer section 303, an N-type floating gate electrode (FG electrode) 313, with an N-type output gate region (first OG region) 313 in-between. Next to the FG region 313 is formed an N-type precharge gate region (PG region) 314.

The aforementioned PG region 314 is constituted by an N-type impurity diffusion region of high impurity concentration. Next to the PG region 314 is formed an N-type drain region 316, with a second output gate region (second OG region) 315 in between. The second OG region 315 is constituted by an N-type impurity diffusion region of high impurity concentration, similarly to the PG region 314.

Characteristic of the charge detection section 304 of the charge transfer device 301 of the present embodiment is the fact that the first OG region 312 is constituted by two areas and the PG region 314 is constituted by a sole region.

The first OG region 312 has its first OG area 312b adjacent to the FG region 313 constituted by an N-type impurity diffusion region of high impurity concentration, while having its other first OG area 312a constituted by an N-type impurity diffusion region of low impurity concentration. Thus a potential having a step shape descending in the direction of the drain region 316 is defined between the first OG areas 312a and 312b.

In the PG region 314, a potential gradient having a downward slope is defined by selectively introducing impurities therein. For example, the N-type impurity diffusion region of high impurity concentration in the PG region 314 is of such pattern configuration that a potential gradient is formed which has a descending slope in the charge transfer direction.

On the charge transfer channel region 305 is formed a polycrystal silicon electrode layer with a gate insulating film 308 of, for example, $SiO_2$, in-between. Specifically, a first OG electrode 318b and a PG electrode 319 are formed on the first OG electrode 318b and on the PG region 314, as the underlying electrode layers, respectively. A first OG electrode 318a, a FG electrode 317 and a second OG electrode 320 are formed on the first OG area 312a, FG region 313 and on the second OG region 315, as overlying electrode layers, respectively.

The dc voltages Vog1, Vog2 are supplied to the first OG electrodes 318a, 318b and the second OG electrode 320, via input terminals $\Phi_3$ and $\Phi_5$, respectively, thereby defining fixed potential barriers below the first OG electrodes 318a, 318b and the second OG electrode 320, respectively. The FG electrode 317 is connected to the output terminal bout via an amplifier 321 formed by, for example, a source follower circuit, formed on the silicon substrate 302. The FG electrode 317 has its gate electrode supplied with the reset pulse Pr, and has its drain terminal connected to a source of a switching transistor, which may for example be an N-channel MOS transistor, supplied with the resetting source voltage Vr. The PG electrode 319 is supplied via input terminal $\Phi_4$ with the control pulse Pg which will be explained subsequently.

When the reset pulse Pr is applied to the gate electrode of the switching transistor T, the transistor Tr is turned on for fixing the FG electrode 317 at the source voltage level Vr. At this time, the potential below the FG electrode 317 is increased to a level corresponding to the source voltage level Vr, so that a potential well is formed below the FG electrode 317. That is, the FG electrode 317 is reset by the reset pulse Pr applied thereto.

The switching transistor Tr is subsequently turned off. If the signal charge e is transferred in this state from the last stage of the charge transfer section 302 to the FG region 313 below the FG electrode 317, a voltage change is produced in the FG electrode 317 in an amount corresponding to the amount of the signal, charge e transferred to the FG region. This voltage change is amplified by the downstream side amplifier 321 and taken out as the output signal S at the output terminal bout.

If, during the time the signal charge e is accumulated below the FG electrode 317, the control pulse Pg is applied to the PG electrode 319, the potential below the PG electrode 319 becomes deeper, such that the potential barrier below the PG electrode neighboring to the Fg electrode 317 becomes lower than the potential well below the FG electrode 317. At this time, the signal charge e accumulated in the potential well below the FG electrode 317 is transferred over the potential barrier to below the PG electrode 319.

When the control pulse Pg ceases to be applied to the PG electrode 319, the potential below the PG electrode 319 becomes shallow, so that the initial state is again reached, that is, the potential barrier below the PG electrode 319 becomes shallower than the potential barrier below the neighboring second OG electrode 320, as shown in FIG. 17. At this time, the signal charge e accumulated below the PG electrode 319 is swept over the potential barrier below the second OG electrode 320 to the neighboring drain region 316.

The N-type charge transfer channel region 305 and the electrode layer in the above-described charge transfer device 301 are produced by the following steps.

First, an N-type impurity, such as phosphorus (P), is ion-implanted on the surface of the P-type silicon substrate 2 for forming the N-type impurity diffusion region (N-region) of high impurity concentration on the entire surface of the silicon substrate 302. A first-layer polycrystal silicon is patterned on the N-type impurity diffusion region (N-region) of high impurity concentration via a gate insulating film 308. Then, using the thus formed first-layer polycrystal silicon as a mask, a P-type impurity, such as boron (B), is ion-implanted for selectively forming an N-type impurity diffusion region (N⁻-region) of low impurity concentration. On the N-type impurity diffusion region (N⁻-region) of low impurity concentration is formed a second-layer polycrystal silicon via the gate insulating film 308.

Thus the charge transfer channel region 305 is constituted by the N-type impurity diffusion regions (N-regions) of high impurity concentration and the N-type impurity diffusion regions (N⁻-regions). of low impurity concentration, arranged in alternation with each other in this sequence beginning from the charge transfer section 303 up to the charge detection section 304. The first-layer electrode is deposited on the N-type impurity diffusion region (N-region) of high impurity concentration, and the second-layer electrode is deposited on the portion of the N-type impurity diffusion region (N⁻-region) of low impurity concentration excluding the second OG region 315.

Subsequently, the TG electrodes 310a, 310b as the second electrode layers are formed on the thus formed N-type impurity diffusion region (N⁻-region) of low impurity concentration.

As for the charge detection section 304, after formation of the N-type impurity diffusion region (N-region), of high impurity concentration, the first OG electrode 318b is formed on the first OG region 312b neighboring to the FG region 313, while the PG electrode 319 as the first-layer electrode is formed on the PG region 314 neighboring to the FG region 313. Then, using the first-layer electrodes 318b, 319 as masks, the P-type impurity is introduced by selective ion implantation for turning the first OG region 312a not adjacent to the FG region 313 and the FG region 313 into the N-type impurity diffusion region (N⁻-region) of low impurity concentration. On the above-mentioned first OG region 312a and the FG region 313, the first OG electrode 318a and the FG electrode 317 are formed as the second electrode layer via the gate insulating film 308, respectively.

By providing the FG electrode 317 as a layer at a higher level than the first OG electrode 318b adjacent to the PG electrode 319 and the PG electrode 319, the P-type impurity may be ion-implanted into the FG region 313 below the FG electrode 317 in self-alignment as far as the charge transfer direction is concerned, so that the N-type impurity diffusion region (N⁻-region) may be formed which is of a lower concentration than the PG region 314. This enables the potential in the PG region 314 to be deeper than the potential in the FG region 313.

The N-type impurity diffusion region is formed on the surface portion of the silicon substrate 302 serving as the PG region 314 by selective ion implantation for producing a downward potential gradient along the charge transfer direction.

Figure 18:
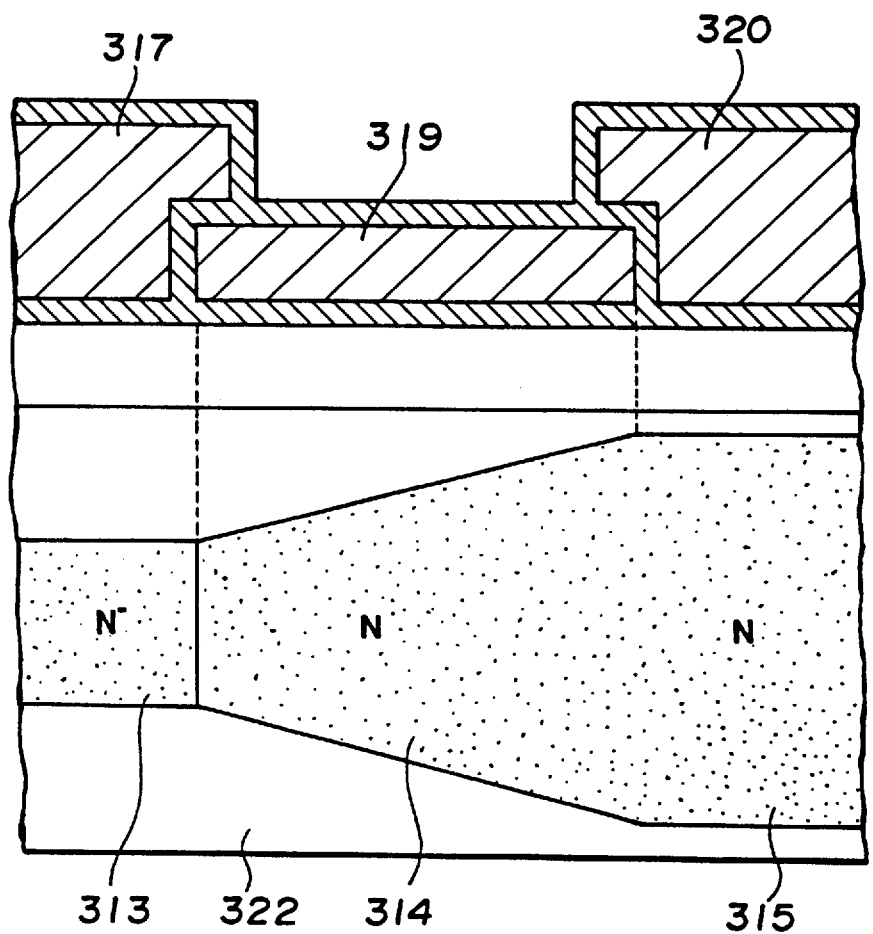
FIG. 18 is a schematic cross-sectional view showing electrode layers in the vicinity of a pre-charge gate of the charge transfer device of the fifth embodiment, with the upper surface of a corresponding channel region being also shown.

Such downward potential gradient along the charge transfer direction may be achieved by the pattern configuration of the PG region 314. An illustrative pattern configuration is shown in FIG. 18 in which the upper surface of the charge transfer channel region 305 in the vicinity of the PG region 314 is shown in contrast with the electrode position. The PG region 314 is formed by the N-type impurity diffusion region (N-region) of high impurity concentration which is patterned so that the diffusion region is continuously enlarged from the beginning end towards the terminal end of the PG region 314 along the charge transfer direction. The region in which the N-type impurity is not introduced serves as a channel stop region 322 for delimiting a charge transfer region.

If the PG region 314 is of the above-described pattern configuration, the charge transfer channel region 305 is increasingly affected by the adjacent channel stop region 322 in a direction towards the upstream side. That is, the potential for the same voltage becomes deeper in a direction towards the downstream side, such that the voltage potential with a downward gradient is formed in a direction along the charge transfer direction.

On the second OG region 315, the second OG electrode 320 is deposited as a second-layer electrode, while the second OG region remains to be the N-type impurity diffusion region (N-region) of high impurity concentration without the second OG region being turned into the N-type impurity diffusion region (N⁻-region) of low impurity concentration by ion implantation of the P-type impurity.

The potential below the second OG electrode 320 needs to be deeper than the potential below the PG electrode 319 when the control pulse Pg ceases to be applied to the PG electrode 319. For this reason, the dc voltage Vog2 is supplied to the second OG electrode 320. Consequently, a deeper potential may be achieved by supplying the larger dc voltage Vog2, even although the second OG region 315 is the N-type impurity diffusion region (N⁻-region) of low impurity concentration. However, the dc voltage Vog of a smaller magnitude suffices if the second OG region 315 remains to be the N-type impurity diffusion region (N-region) of high impurity concentration.

The charge transfer device 301 of the above-described embodiment is arranged so that, if the reset pulse Pr applied to the FG electrode 317 is of the same voltage level as the voltage used as the control pulse Pg applied to the PG electrode 319, the potential below the FG electrode 317 becomes shallower than the potential below the PG electrode 319 neighboring to the FG electrode 317. Consequently, by applying to the PG electrode 319 a voltage of the same level as the resetting source voltage Vr applied to the FG electrode 317, the signal charge e accumulated below the FG region 313 may be transferred to the PG region 314.

This eliminates the necessity of connecting the PG electrode 319 to the booster circuit, while enabling the voltage to be applied from the same voltage source to the FG electrode 317 and to the PG electrode 319. Consequently, there is no risk of the booster circuit occupying a large area to restrict the area for forming the charge transfer section 303 and the peripheral circuit.

In addition, since the PG region 314 of the charge transfer device 301 has a downward gradient along the charge transfer direction, the signal charge e accumulated in the potential well in the FG region 313 may be smoothly transferred towards the drain region after riding over the potential barrier in the PG region 314.

In the fifth embodiment, the N-type charge transfer region 305 is formed by first forming the N-type impurity diffusion region (N-region) of high impurity concentration on the surface of the P-type silicon substrate 302. In a sixth embodiment of the present invention, which is now explained, the N-type impurity diffusion region (N⁻region) of low impurity concentration is first formed.

Figure 19:
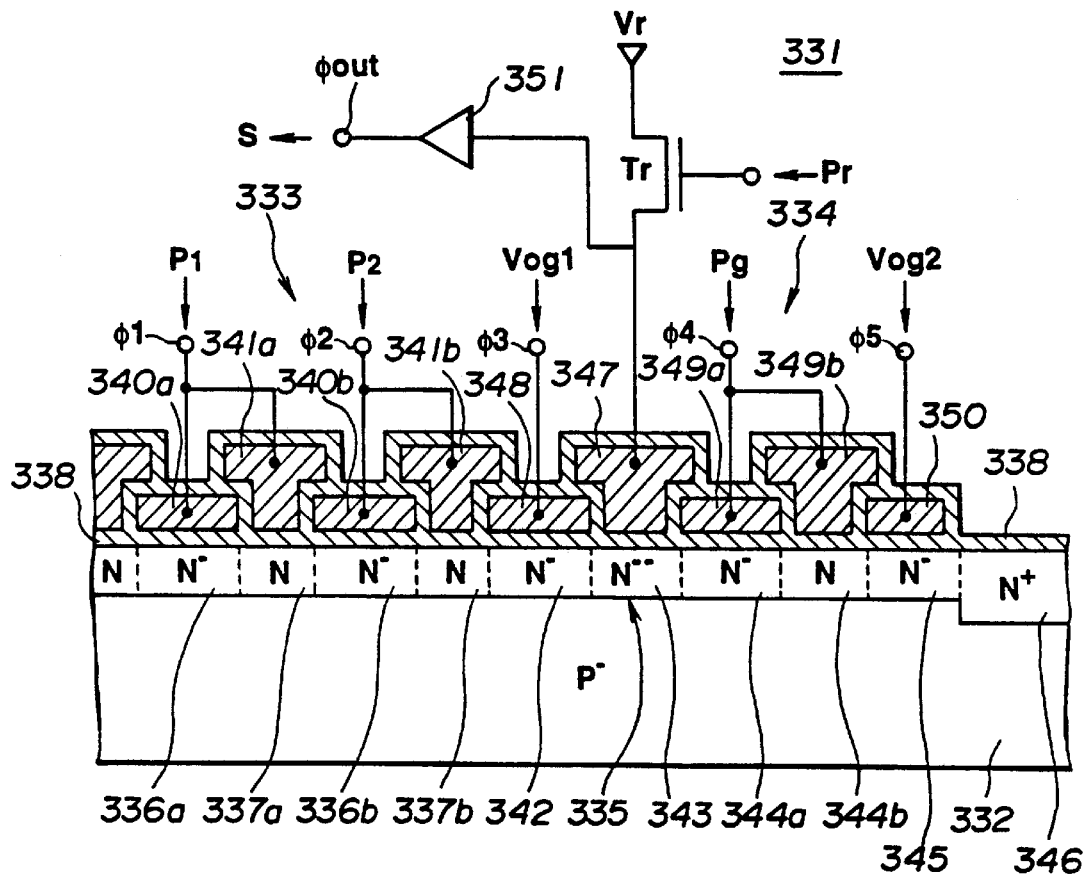
FIG. 19 is a cross-sectional view schematically showing a charge transfer device according to a sixth embodiment of the present invention.

Referring to FIG. 19, a charge transfer device 331 according to the sixth embodiment has a P-type silicon substrate 332, for example, on which there are formed an input unit, not shown, a charge transfer section 333, for sequentially transferring signal charges supplied from the input unit, and a charge detection unit 334 for detecting signal charges transferred by the charge transfer section 333, as in the previously described charge transfer device 301.

The charge transfer section 333 is of the two-phase driving transfer system in which the signal charge is transferred using oppositely phased driving pulses $P_1$ and $P_2$.

Figure 20:
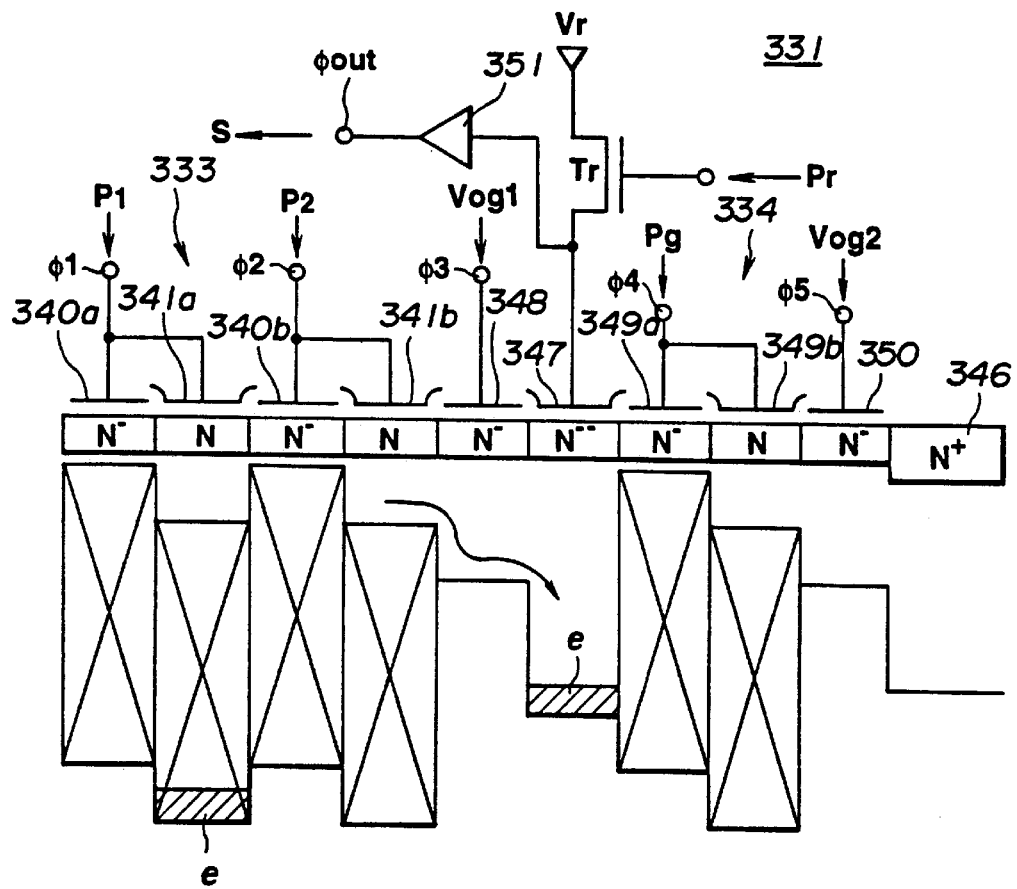
FIG. 20 schematically shows the potential in the vicinity of a floating gate amplifier of the charge transfer device of the sixth embodiment.

That is, as shown in part in FIGS. 19 and 20, transfer gate regions (TG regions) 336a, 336b, formed by N-type impurity diffusion regions of low impurity concentration, and storage gate regions (SG regions) 337a, 337b, formed by N-type impurity diffusion regions of high impurity concentration, are alternately arrayed in contiguity to one another in one direction on the surface portion of the silicon substrate 302. TG electrodes 340 and SG electrodes 341 are formed in register with the TG regions 336 and the SG regions 337, respectively. The signal charge e is transferred towards the charge detection section 334 by a two-phase driving system by the driving pulses $P_1$, $P_2$ being supplied to the set of odd-numbered TG electrodes 340a and SG electrodes 341a via the input terminal $\Phi_1$ and to the set of the even-numbered TG electrodes 340b and SG electrodes 341b via the input terminal $\Phi_2$, respectively.

However, in the present embodiment, the TG electrodes 340a, 340b formed on the TG regions 336a, 336b, which are the N-type impurity diffusion regions (N$^-$-regions) of low impurity concentration, are formed by the first-layer electrode, while the SG electrodes 341a, 341b formed on the SG regions 337a, 337b, which are the N-type impurity diffusion regions (N-regions) of high impurity concentration, are formed by the second-layer electrode. That is, the relative height level of the TG electrode 340 and the SG electrode 341 is reversed from that in the charge transfer device 301.

The charge detection section 334 is constituted by a floating gate amplifier in which an N-type FG region 343 is formed next to the SG region 337b of the last stage of the charge transfer section 333, with the N-type first OG region 342 in-between, and N-type PG regions 344a, 344b are formed next to the FG region 343. The charge detecting section 334 differs from that of the fifth embodiment in that the first OG region 312 is comprised of only one region consisting of an N-type impurity diffusion region (N$^-$-region) of low impurity concentration.

The PG region 344 has its PG area 344a adjacent to the FG region 343 formed by the N-type impurity diffusion region (N$^-$-region) of low impurity concentration, while having its other PG area 344b formed by the N-type impurity diffusion region (N-region) of high impurity concentration. Next to the other PG area 344b is formed an N-type drain region 346 with a N-type second OG region 345 in-between.

On the charge transfer channel 335 is formed an electrode layer of polycrystal silicon with a gate insulating film 338 of, for example, $SiO_2$, in-between. Specifically, the first OG electrode 348, the PG electrode 344a and the second OG electrode 350 are formed on the first OG region 342, PG region 344a and on the second OG region 345, as underlying electrode layers, respectively, while the FG electrode 349 and the PG electrode 349b are formed on the FG region 343 and on the PG region 344b, as overlying electrode layers, respectively.

The dc voltages Vog1, Vog2 are supplied to the first OG electrode 348 and the second OG electrode 350, via input terminals $\Phi_3$ and $\Phi_5$, respectively, thereby defining fixed potential barriers below the first OG electrode 348 and the second OG electrode 350, respectively. The FG electrode 347 is connected to the output terminal $\Phi$out via an amplifier 351 formed by, for example, a source follower circuit, formed on the silicon substrate 332. The FG electrode 347 has its gate electrode supplied with the reset pulse Pr, and has its drain terminal connected to a source of a switching transistor, which is an N-channel MOS transistor, supplied with the resetting source voltage Vr. The PG electrodes 349a, 349b are supplied via input terminal $\Phi_4$ with the control pulse Pg which will be explained subsequently.

The amount of the signal charge e transferred from the last stage of the charge transfer section 333 is detected by the change in voltage of the FG electrode 347, in the same manner as in the previous fifth embodiment. The signal charge e is then swept towards the drain region 346.

The N-type charge transfer channel region 335 and the electrode layer in the above-described charge transfer device 331 are produced by the following steps.

First, an N-type impurity, such as phosphorus (P), is ion-implanted on the surface of the P-type silicon substrate 332 for forming the N-type impurity diffusion region (N$^-$-region) of low impurity concentration on the entire surface of the silicon substrate 332. A first-layer polycrystal silicon is patterned on the N-type impurity diffusion region (N$^-$-region) of low impurity concentration via a gate insulating film 338. Then, using the thus formed first-layer polycrystal silicon as a mask, an N-type impurity, such as arsenic (Ar), is ion-implanted for selectively forming an N-type impurity diffusion region (N-region) of high impurity concentration. On the N-type impurity diffusion region (N-region) of high impurity concentration is formed a second-layer polycrystal silicon via the gate insulating film 338.

Thus the charge transfer channel region 335 is constituted by the N-type impurity diffusion regions (N-regions) of high impurity concentration and the N-type impurity diffusion regions (N$^-$-regions) of low impurity concentration, alternately arranged in this sequence beginning from the charge transfer section 333 up to the charge detection section 334, with the exception of the FG region 343. The first-layer electrode is deposited on the N-type impurity diffusion region (N$^-$-region) of low impurity concentration, and the second-layer electrode is deposited on the portion of the N-type impurity diffusion region (N-region) of high impurity concentration excluding the second FG region 347.

That is, as for the charge transfer section 333, the TG electrodes 340a, 340b are formed as the first-layer electrode layers on the N-type impurity diffusion region (N$^-$-region) of low impurity concentration, after which the N-type impurity diffusion region (N-region) of high impurity concentration is formed. Subsequently, the SG electrodes 341a, 341b as the second electrode layers are formed on the thus formed N-type impurity diffusion region (N-region) of high impurity concentration.

As for the charge detection section 334, after formation of the N-type impurity diffusion region (N$^-$-region) of low impurity concentration, the first OG electrode 348 is formed on the first OG region 342 neighboring to the FG region 343, while the PG electrode 349 as the first-layer electrode layer is formed on the PG region 344a neighboring to the FG region 343 and the second OG electrode 350 is formed as the first-layer electrode layer on the second OG region 345.

Then, using the PG electrodes 349a and 350 as masks, the N-type impurity is introduced by selective ion implantation for turning the first OG region 344b into the N-type impurity diffusion region (N-region) of high impurity concentration. Then, using the first OG electrodes 348 and the PG electrode 349a as masks, the P-type impurity is introduced by selective ion implantation for turning the FG region 343 into an N-type impurity diffusion region (N⁻-region) of still lower impurity concentration. The FG electrode 347 and the PG electrode 349b are then formed as the second-layer electrodes on the FG region 343 and the PG region 344 via the gate insulating film 338.

By providing the FG electrode 347 as a layer at a higher level than the first OG electrode 348 adjacent to the FG electrode 347 and the PG electrode 349a, the P-type impurity may be ion-implanted into the FG region 343 in self-alignment as far as the charge transfer direction is concerned, so that the N-type impurity diffusion region (N⁻-region) may be formed which is of a lower concentration than the PG region 344a. This enables the potential in the PG region 344a to be deeper than the potential in the FG region 343.

With the above-described charge transfer device 331 of the present embodiment, if the reset pulse Pr applied to the FG electrode 347 and the voltage used as the control pulse Pg applied to the PG electrode 349 are of the same voltage level, the potential below the FG electrode 347 is shallower than the potential below the PG electrode 349a neighboring to the FG electrode 347. Consequently, by applying the voltage of the same level as the resetting source voltage Vr applied to the FG electrode 347 to the PG electrode 349, the signal charge e accumulated below the FG region 343 may now be transferred to the PG region 344.

This eliminates the necessity of connecting the PG electrode 349 to the booster circuit, without increasing the number of electrodes as compared to the conventional charge transfer device, or otherwise complicating the circuit construction, while enabling the voltage to be applied from the same voltage source to the FG electrode 347 and to the PG electrode 349. Consequently, there is no risk of the booster circuit occupying a large area to restrict the area for forming the charge transfer section 333 and the peripheral circuit.

Although the PG electrode 349 is constituted by two electrodes, it may be constituted by a sole electrode, as in the above-described fifth embodiment. In such case, the voltage gradient of the channel region is downward along the charge transfer direction by selective impurity introduction.

In this manner, it is possible with the above-described charge transfer devices 301, 331 to reduce the size and improve the performance without increasing the number of electrodes or otherwise complicating the construction as compared to the conventional charge transfer device.

What is claimed is:

1. A charge transfer device comprising charge transfer means for transferring charges, a floating diffusion layer for accumulating the charges transferred from said charge transfer means, a floating gate electrode formed on said floating diffusion layer via an insulating layer, charge detection means connected to said floating gate electrode for outputting a voltage corresponding to an amount of charges accumulated in said floating diffusion layer, first precharge means connected to said floating gate electrode, said first precharge means starting pre-charging of said floating gate electrode responsive to transition of a first pulse voltage from a first state to a second state, said first precharge means terminating pre-charging of said floating gate electrode responsive to transition of the first pulse voltage from the second state to the first state, second precharge means connected to said floating diffusion layer, said second precharge means starting pre-charging of said floating diffusion layer responsive to transition of a second pulse voltage from a third state to a fourth state, said second precharge means terminating pre-charging of said floating diffusion layer responsive to transition of the second pulse voltage from the fourth state to the third state, first pulse supply means for supplying said first pulse voltage to said first precharge means, and second pulse supply means for supplying said second pulse voltage to said second precharge means, transition of said second pulse voltage from the third state to the fourth state being produced following transition of said first pulse voltage from the first state to the second state.

2. The charge transfer device as claimed in claim 1 wherein transition of said first pulse voltage from the second state to the first state is produced following transition of said second pulse voltage from the fourth state to the third state.

3. The charge transfer device as claimed in claim 2, wherein said first and second precharging means are periodically activated for draining of the charges accumulated in said floating gate diffusion layer by deactivating each said second pulse voltage during the time said first pulse voltage is supplied to said first precharging means, thereby to complete draining charges accumulated in said floating diffusion layer during the time said first pulse voltage is supplied to first said precharging means.

4. The charge transfer device of claim 2, wherein said first precharging means comprises a switch connected between said power source and said floating gate electrode for controlling connection of said power source to said floating gate electrode, said first pulse supply means for supplying said first pulse voltage to said precharging means comprising means for supplying periodic reset pulses employed for activating said switch, and said pulse voltage comprising control pulses.

5. The charge transfer device of claim 4, wherein said first and second supply means comprise actuating means for activating periodic draining of said charges accumulated in said floating gate diffusion layer by deactivating each said control pulse during the time said switch connects said power source to said floating gate electrode, said actuating means being configured to complete draining of the charges accumulated in said floating diffusion layer during the time said switch connects said power source to said floating gate electrode, said activating means having a timing means for starting each said reset pulse before each said control pulse and deactivating each said control pulse before deactivating each said reset pulse during each periodic draining.

6. A charge transfer device comprising:

charge transfer means for transferring charges, a floating diffusion layer for accumulating the charges transferred from said charge transfer means, a floating gate electrode formed on said floating diffusion layer with an insulating layer therebetween, charge detection means connected to said floating gate electrode for outputting a voltage corresponding to an amount of charges accumulated in said floating diffusion layer;

precharge gate means coupled to said floating diffusion layer and said floating gate electrode and having precharge gate electrodes for receiving periodic control pulses to create periodic potential barriers in said precharge gate means which are lower than a potential well in the floating diffusion layer;

a power source;

a switch connected between said power source and said floating gate electrode for controlling connection of said power trace to the floating gate electrode, said switch activated by periodic reset pulses;

means for draining charges accumulated in said floating diffusion layer; and actuating means for activating periodic draining of the charges accumulated in said floating gate diffusion layer by deactivating each said control pulse during the time said switch connects said power source to said floating gate electrode, said actuating means being configured to complete draining of the charges accumulated in said floating diffusion layer during the time said switch connects said power source to said floating gate electrode, said actuating means having a timing means for starting each said reset pulse before each said control pulse and deactivating each said control pulse before deactivating each said reset pulse during each periodic draining;

wherein said actuating means completes draining of the charges accumulated in said floating diffusion layer during the time said switch connects said power source to said floating gate electrode.

* * * * *